US009570545B2

(12) United States Patent
Dong et al.

(10) Patent No.: US 9,570,545 B2
(45) Date of Patent: Feb. 14, 2017

(54) HIGH VOLTAGE TRENCH TRANSISTOR

(71) Applicant: GLOBALFOUNDRIES Singapore Pte. Ltd., Singapore (SG)

(72) Inventors: Yemin Dong, Singapore (SG); Liang Yi, Singapore (SG); Zhanfeng Liu, Singapore (SG); Purakh Raj Verma, Singapore (SG); Ramadas Nambatyathu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/692,768

(22) Filed: Apr. 22, 2015

(65) Prior Publication Data
US 2015/0236085 A1 Aug. 20, 2015

Related U.S. Application Data

(60) Division of application No. 13/948,178, filed on Jul. 23, 2013, now Pat. No. 9,054,133, which is a
(Continued)

(51) Int. Cl.
*H01L 29/66* (2006.01)
*H01L 29/06* (2006.01)
(Continued)

(52) U.S. Cl.
CPC ......... *H01L 29/063* (2013.01); *H01L 29/0878* (2013.01); *H01L 29/407* (2013.01); *H01L 29/7813* (2013.01)

(58) Field of Classification Search
CPC ............... H01L 29/7813; H01L 29/407; H01L 29/4236; H01L 29/7827; H01L 29/66734; H01L 29/1095; H01L 29/0634; H01L 29/66666; H01L 29/4232; H01L 29/7809; H01L 29/7825; H01L 29/7802; H01L 29/402; H01L 21/823487; H01L 29/41775; H01L 29/7801; H01L 29/66348; H01L 29/66674
(Continued)

(56) References Cited

U.S. PATENT DOCUMENTS

| 4,893,160 A | 1/1990 | Blanchard |
|---|---|---|
| 4,914,058 A | 4/1990 | Blanchard |

(Continued)

FOREIGN PATENT DOCUMENTS

| CN | 1264158 A | 8/2000 |
|---|---|---|
| CN | 101211982 A | 7/2008 |

(Continued)

OTHER PUBLICATIONS

Simon Sze, Physics of Semiconductor Element and Fabricating Method Thereof, 2003.

*Primary Examiner* — Benjamin Sandvik
*Assistant Examiner* — Herve Assouman
(74) *Attorney, Agent, or Firm* — Horizon IP Pte. Ltd.

(57) ABSTRACT

A method of forming a device is disclosed. A substrate defined with a device region is provided. A gate having a gate electrode, first and second gate dielectric layers is formed in a trench. The trench has an upper trench portion and a lower trench portion. A field plate is formed in the trench. First and second diffusion regions are formed. The gate is displaced from the second diffusion region.

20 Claims, 36 Drawing Sheets

Related U.S. Application Data continuation-in-part of application No. 13/552,607, filed on Jul. 18, 2012, now Pat. No. 8,999,769, and a continuation-in-part of application No. 13/939,166, filed on Jul. 10, 2013, now Pat. No. 8,786,013, which is a division of application No. 13/237,969, filed on Sep. 21, 2011, now Pat. No. 8,492,226.

(60) Provisional application No. 61/674,838, filed on Jul. 23, 2012.

(51) Int. Cl.
*H01L 29/78* (2006.01)
*H01L 29/40* (2006.01)
*H01L 29/08* (2006.01)

(58) Field of Classification Search
USPC .............. 257/329, 337, 339, 343, 140, 192, 368,257/288, 488, 491
See application file for complete search history.

(56) References Cited

U.S. PATENT DOCUMENTS

| | | |
|---|---|---|
| 4,941,026 A | 7/1990 | Temple |
| 4,954,854 A | 9/1990 | Dhong et al. |
| 5,082,795 A | 1/1992 | Temple |
| 5,326,711 A | 7/1994 | Malhi |
| 5,637,898 A | 6/1997 | Baliga |
| 5,998,833 A | 12/1999 | Baliga |
| 6,262,453 B1 | 7/2001 | Hshieh |
| 6,316,807 B1 * | 11/2001 | Fujishima ............ H01L 29/7834 257/333 |
| 6,359,308 B1 | 3/2002 | Hijzen et al. |
| 6,621,121 B2 | 9/2003 | Baliga |
| 6,674,124 B2 | 1/2004 | Hshieh et al. |
| 6,787,847 B2 | 9/2004 | Disney |
| 6,787,848 B2 | 9/2004 | Ono et al. |
| 7,319,256 B1 | 1/2008 | Kraft et al. |
| 7,504,690 B2 | 3/2009 | Kelly et al. |
| 7,576,388 B1 | 8/2009 | Wilson et al. |
| 7,615,847 B2 | 11/2009 | Zundel et al. |
| 7,625,793 B2 | 12/2009 | Calafut |
| 7,633,120 B2 | 12/2009 | Hébert |
| 7,807,576 B2 | 10/2010 | Pan |
| 7,910,437 B1 | 3/2011 | Baek et al. |
| 7,968,940 B2 | 6/2011 | Udrea |
| 7,977,193 B1 * | 7/2011 | Disney ................. H01L 29/407 257/E29.257 |
| 8,278,731 B2 | 10/2012 | Sumitomo et al. |
| 2002/0036319 A1 | 3/2002 | Baliga |
| 2003/0006428 A1 | 1/2003 | Palm et al. |
| 2006/0131647 A1 | 6/2006 | Meyer |
| 2008/0035987 A1 | 2/2008 | Hebert |
| 2009/0127624 A1 * | 5/2009 | Sumitomo ........ H01L 21/76243 257/350 |
| 2009/0152624 A1 | 6/2009 | Hiller et al. |
| 2010/0140687 A1 | 6/2010 | Chu et al. |
| 2010/0244125 A1 | 9/2010 | Sonsky et al. |
| 2011/0127602 A1 | 6/2011 | Mallikarjunaswamy |

FOREIGN PATENT DOCUMENTS

| | | |
|---|---|---|
| CN | 101290936 A | 10/2008 |
| CN | 101383377 A | 3/2009 |
| DE | 102008039881 A1 | 4/2009 |

* cited by examiner

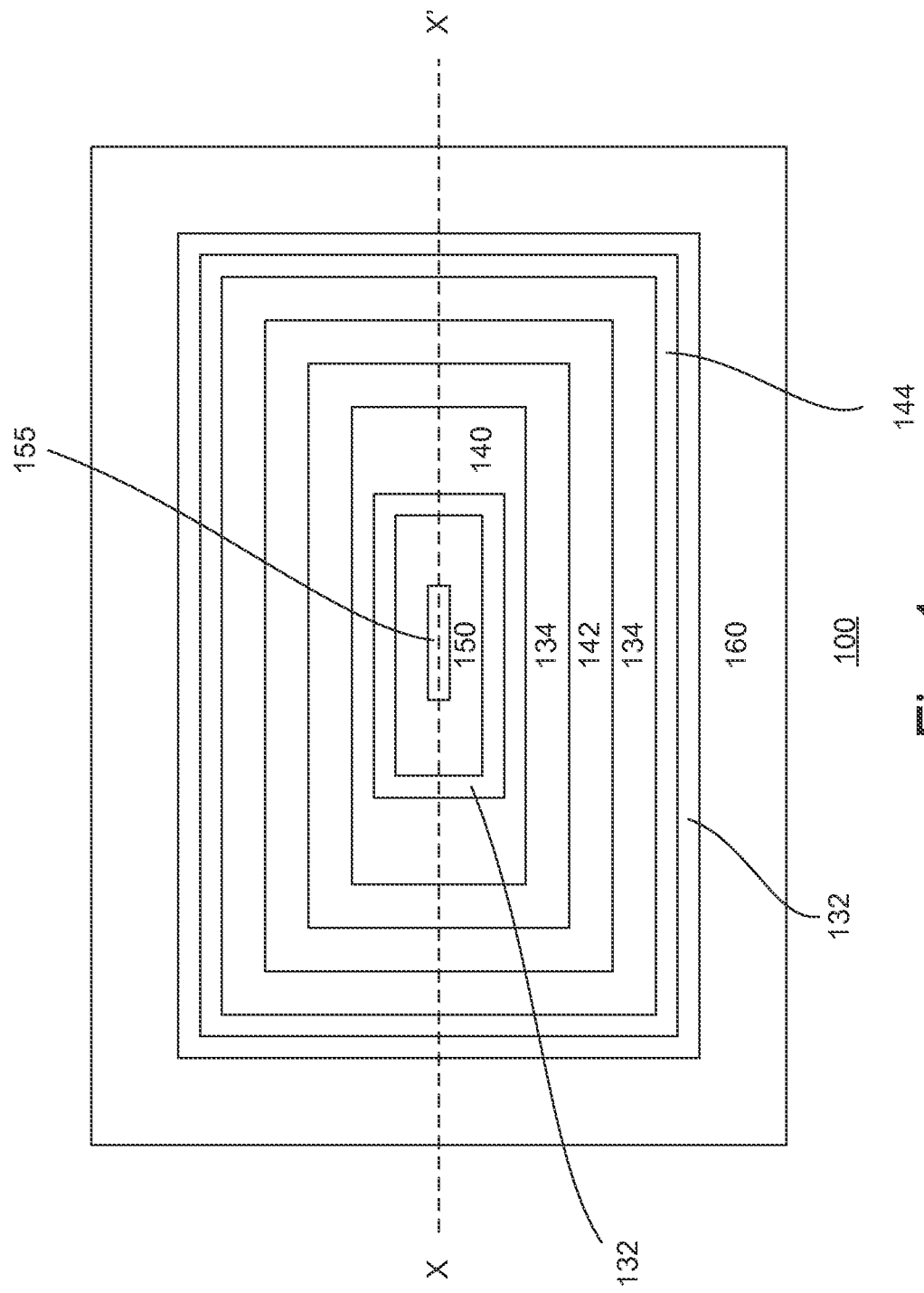

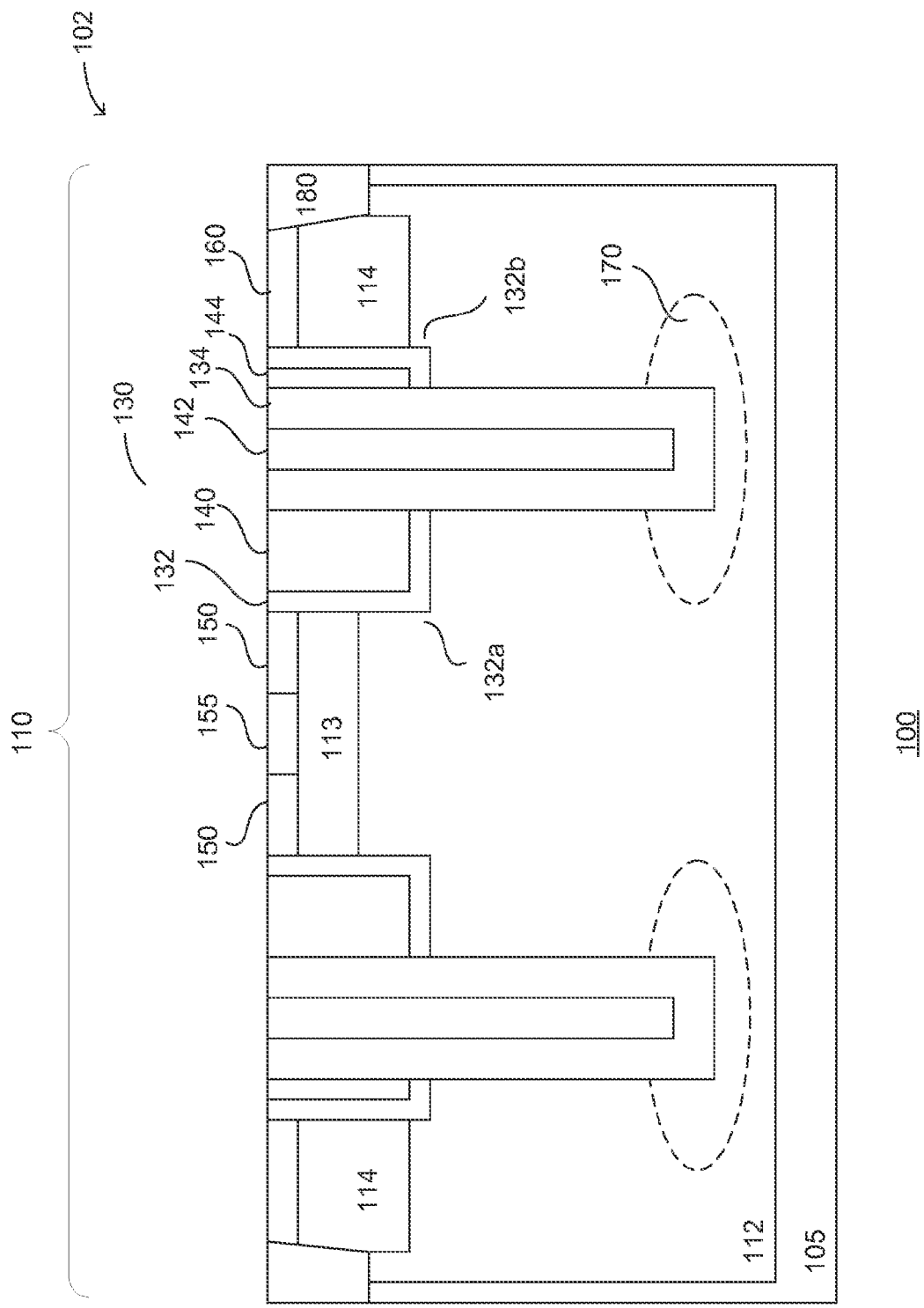

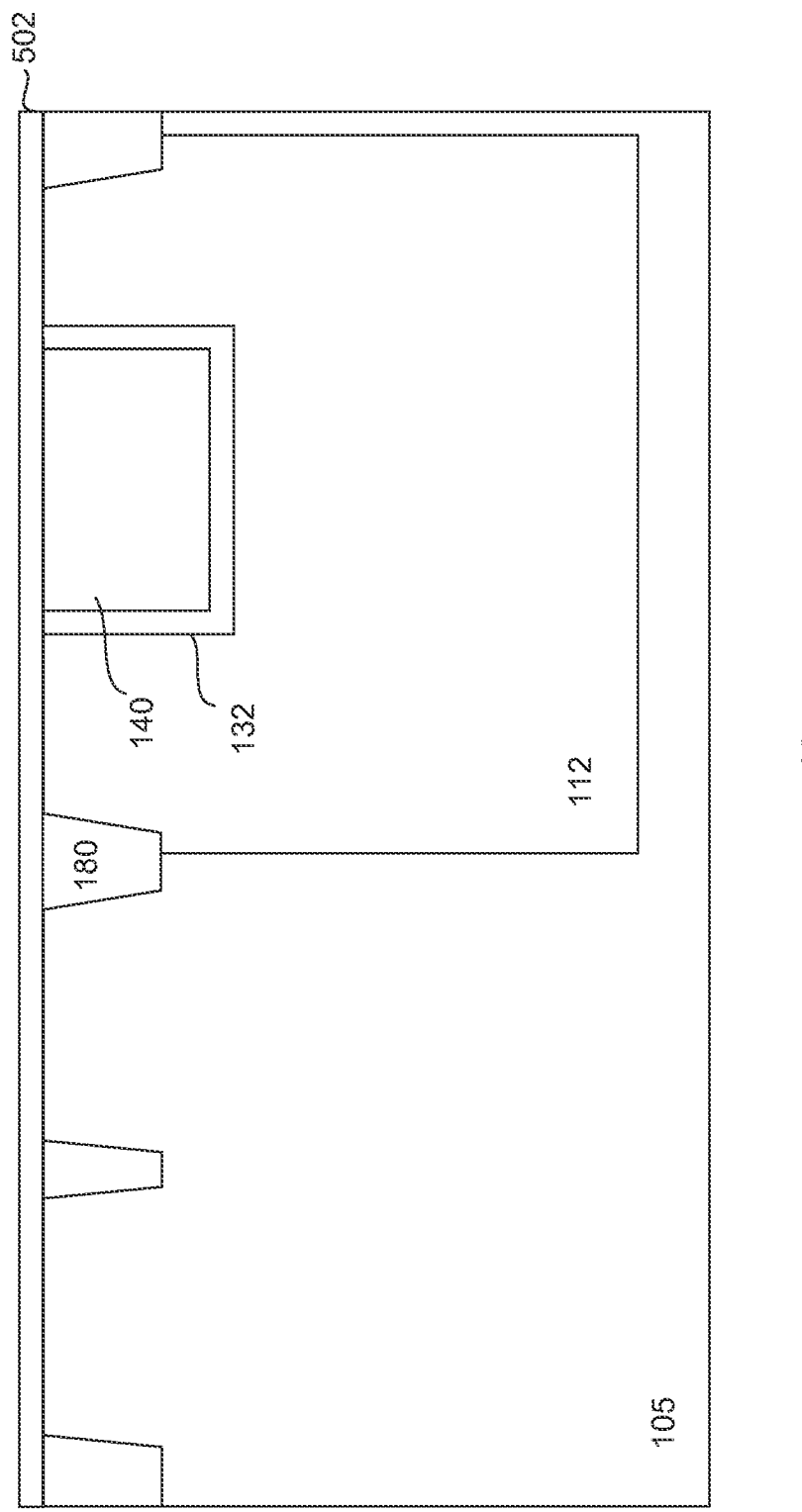

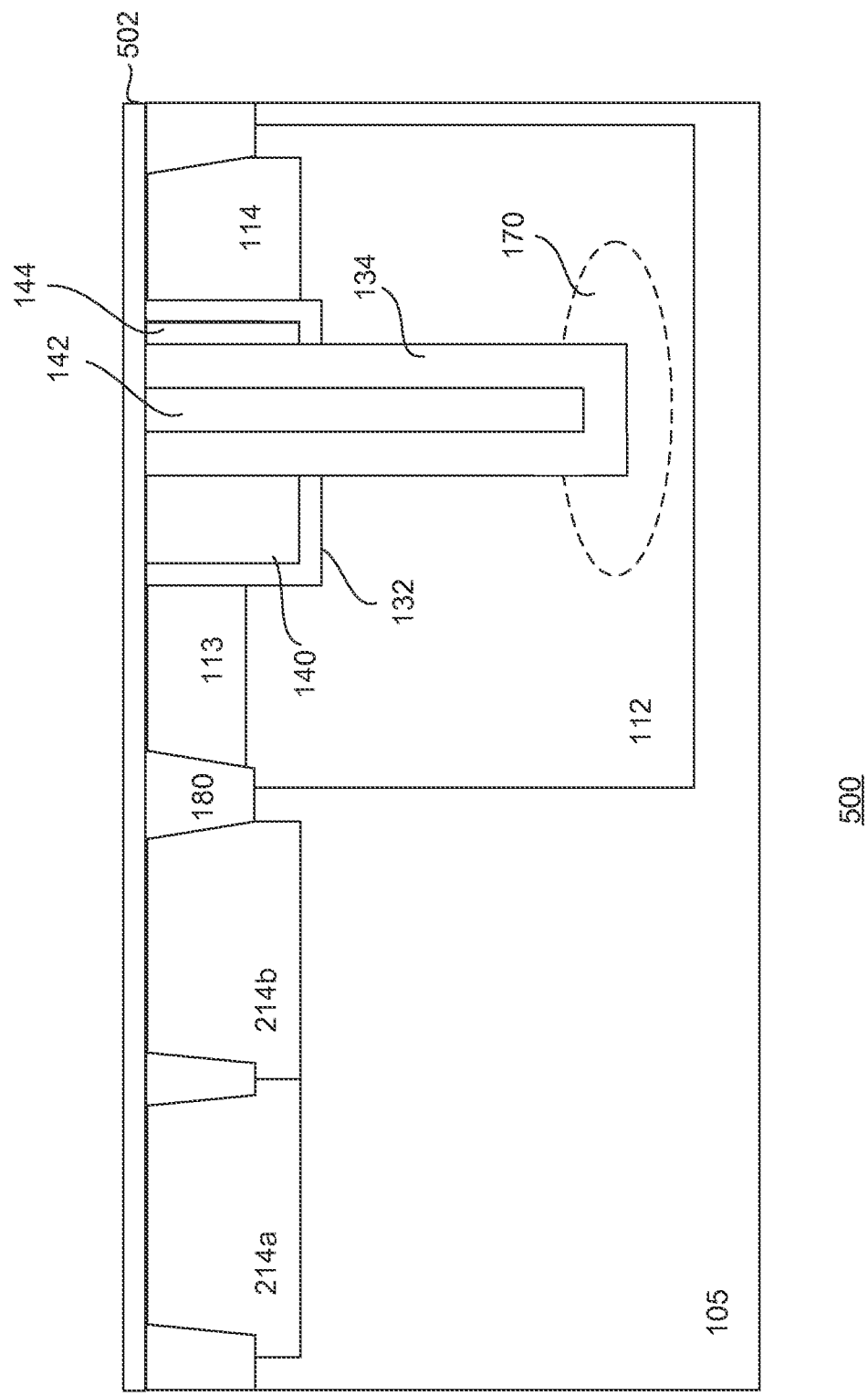

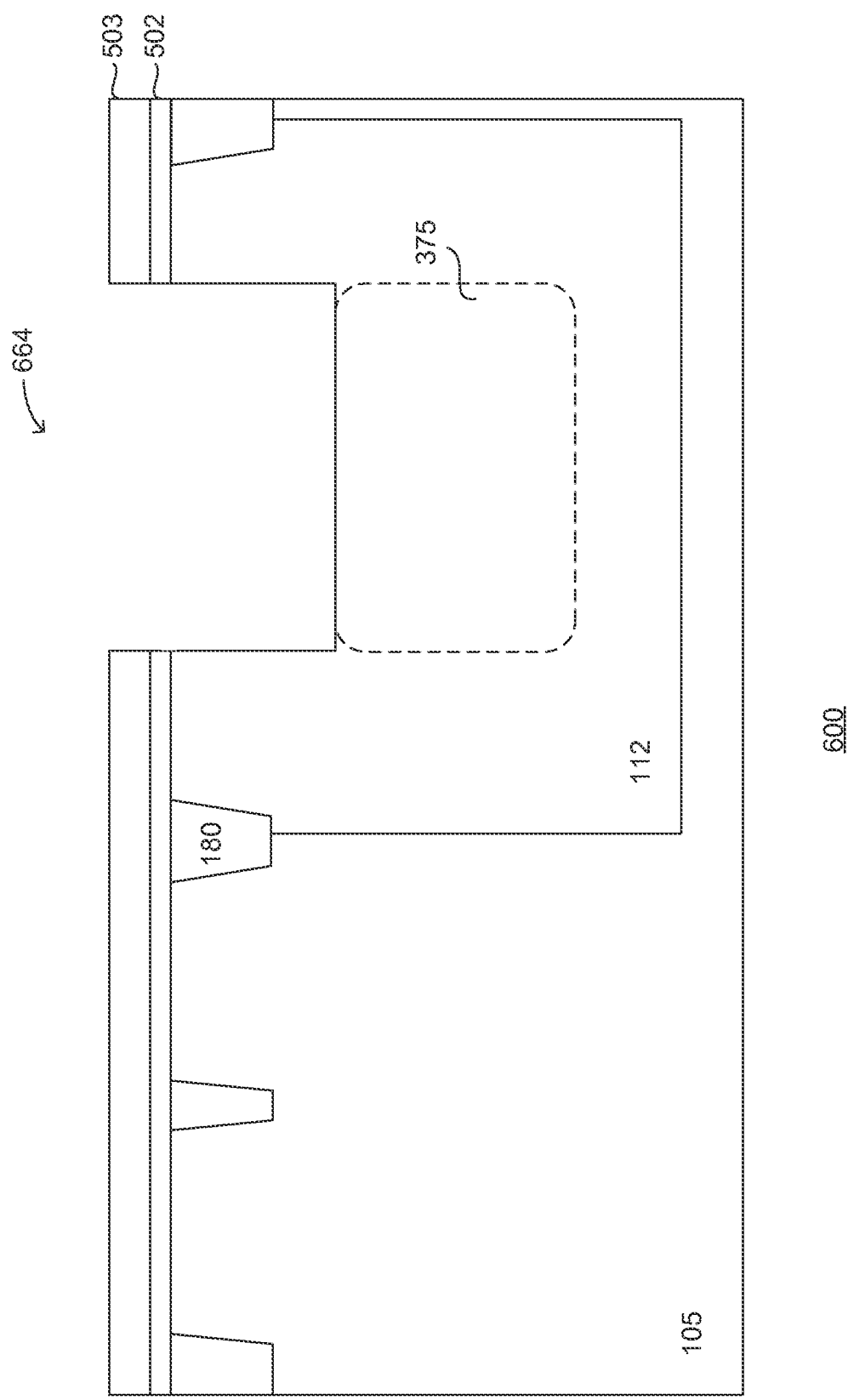

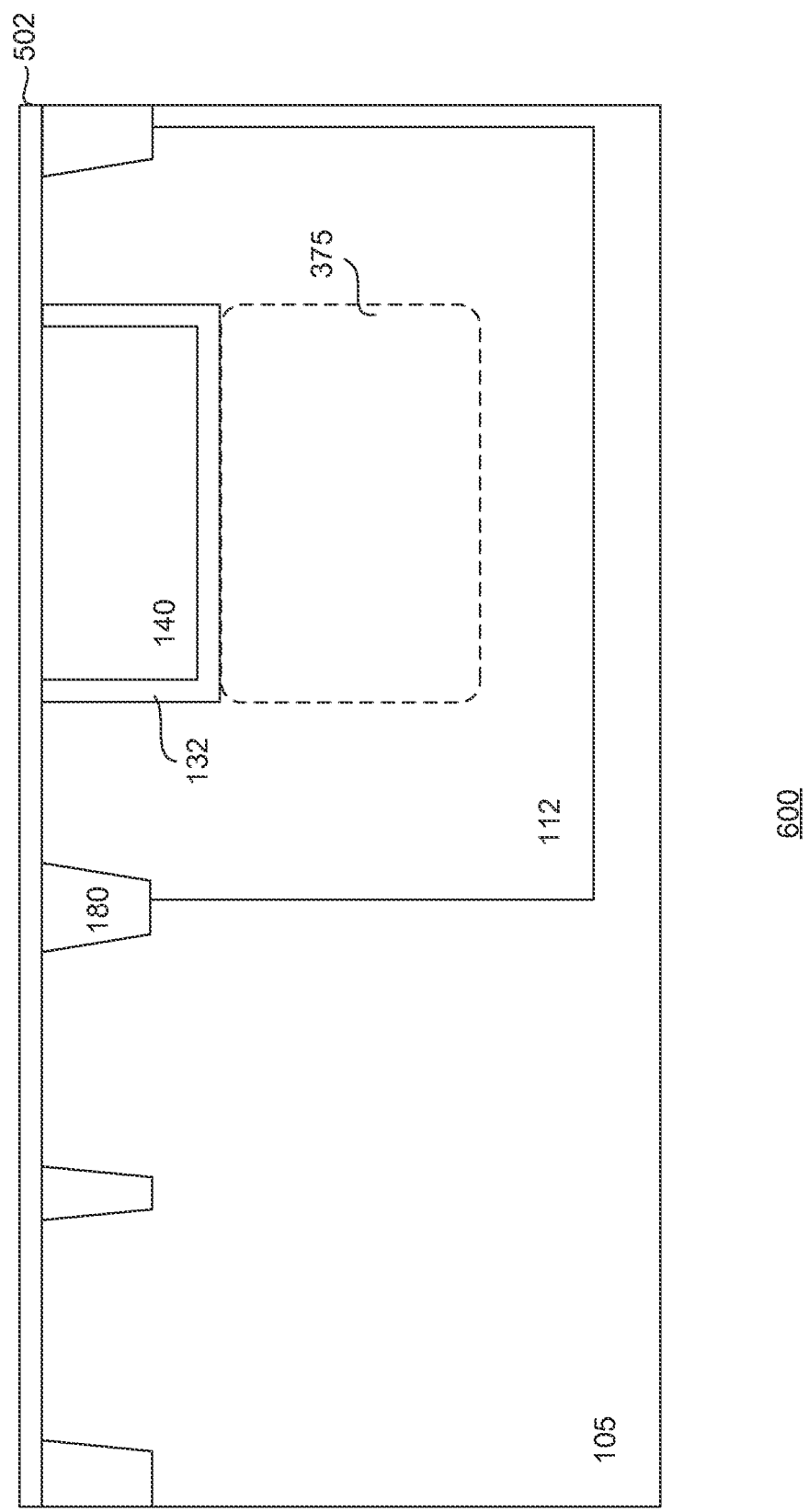

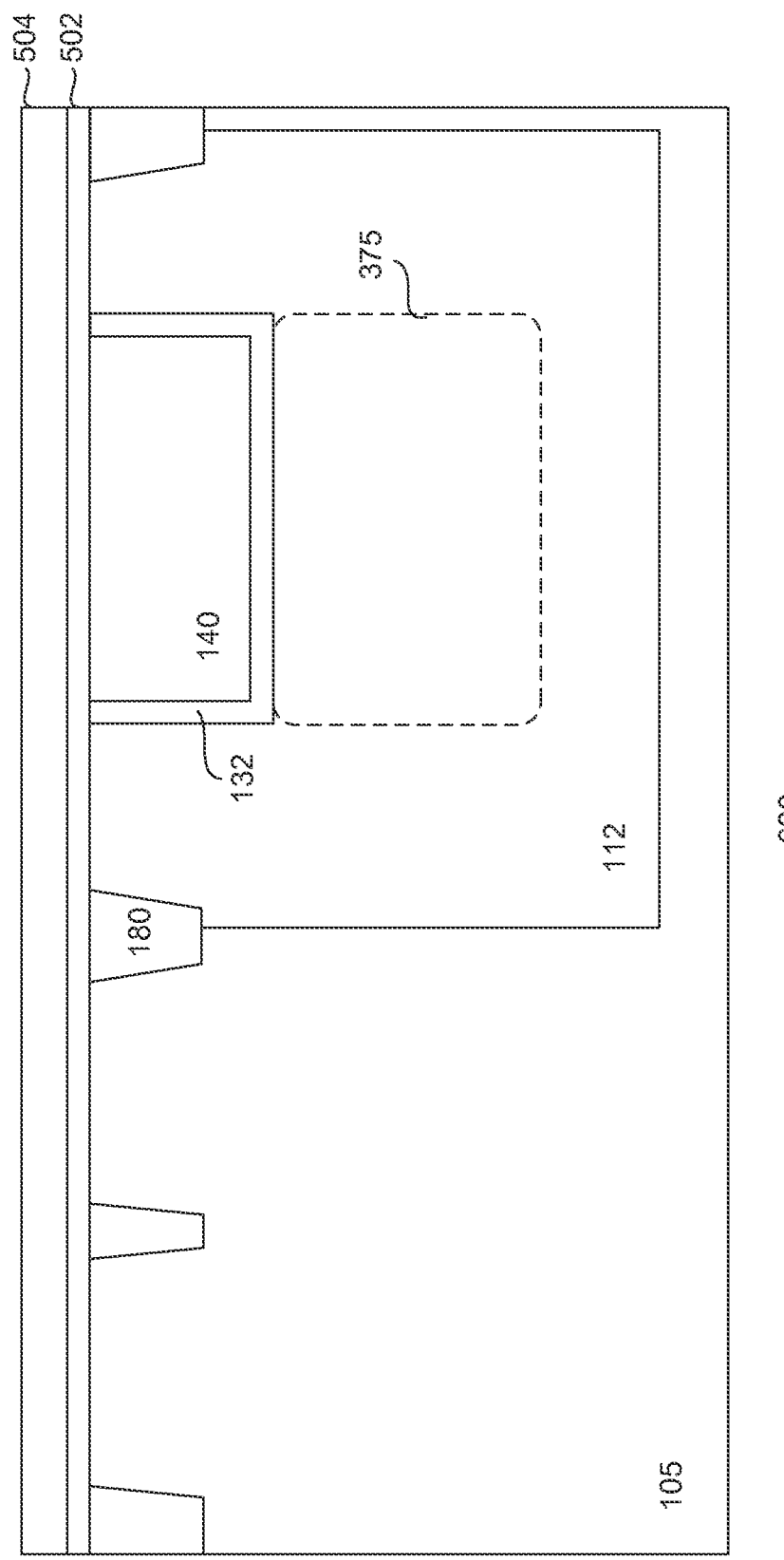

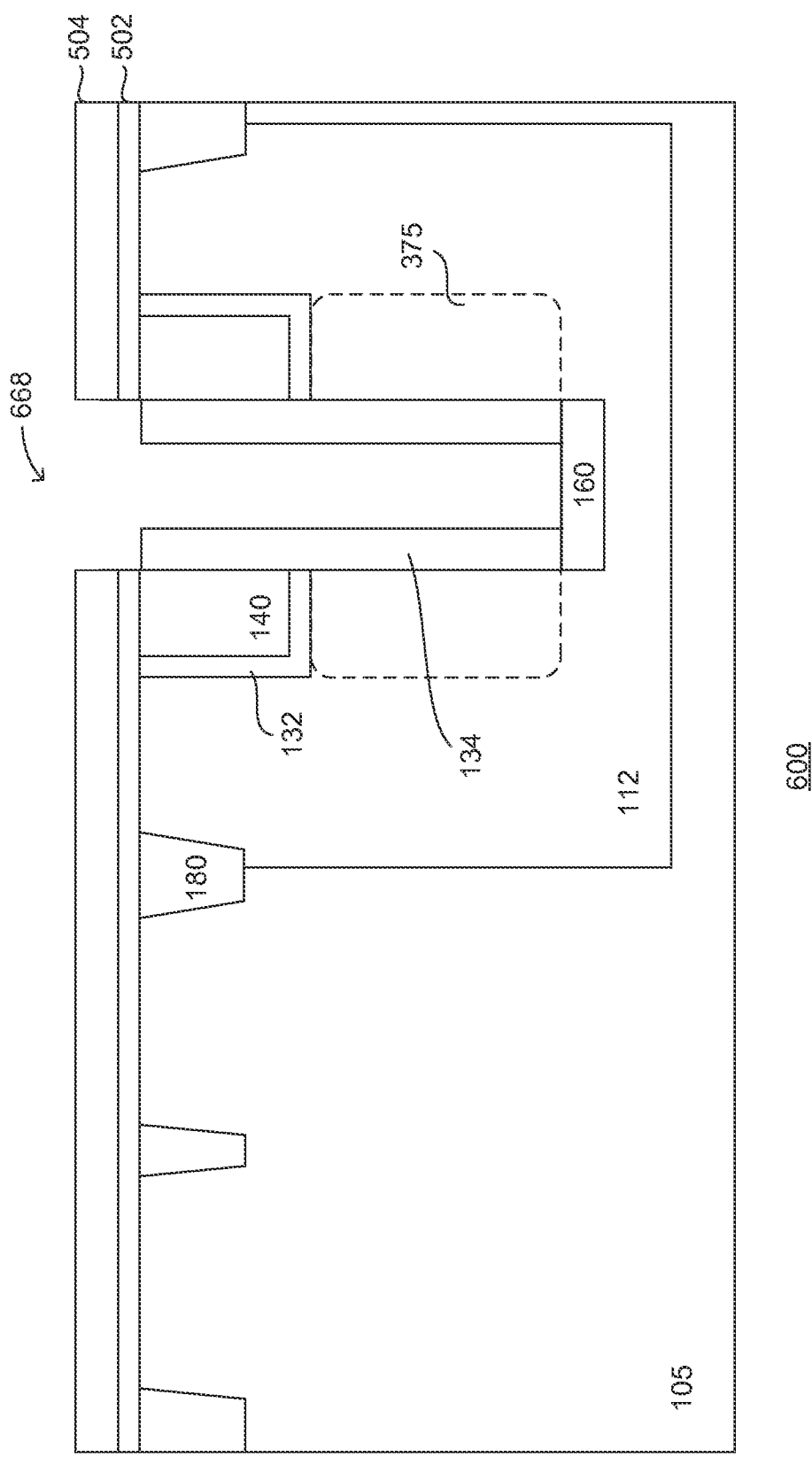

HIGH VOLTAGE TRENCH TRANSISTOR

CROSS-REFERENCE TO RELATED APPLICATIONS

This application is a divisional application of co-pending U.S. patent application Ser. No. 13/948,178, filed on Jul. 23, 2013, which claims the benefit of U.S. Provisional Patent Application Ser. No. 61/674,838, filed on Jul. 23, 2012 and is a continuation-in-part of U.S. patent application Ser. No. 13/552,607, filed on Jul. 18, 2012 and is a continuation-in-part of U.S. patent application Ser. No. 13/939,166, filed on Jul. 10, 2013, now U.S. Pat. No. 8,786,013, which is a divisional application of U.S. patent application Ser. No. 13/237,969, filed on Sep. 21, 2011, now U.S. Pat. No. 8,492,226. All disclosures are herein incorporated by reference in their entireties for all purposes.

BACKGROUND

High voltage field-effect transistors having high breakdown voltage and low on-state resistance are used in, for example, power management products. Such high voltage field-effect transistors include lateral double-diffused (LD) transistors. The performance of the LD transistors depends on the drain-to-source on-resistance ($R_{dson}$) as well as breakdown voltage. For example, low $R_{dson}$ results in high switching speed while high breakdown voltage ($BV_{dss}$) increases reliability.

High breakdown voltage may be achieved by increasing the device pitch. For example, an expanded drain region may be provided along the surface of the substrate, increasing the drain-to-gate surface area on the substrate. The higher the desired breakdown voltage, the larger the expanded drain region or larger the drain-to-gate surface area on the substrate. This however increases gate-to-drain capacitance, resulting in a larger $R_{dson}$ which negatively impacts the switching speed of the transistor. As such, conventional LD transistors achieve a high breakdown voltage by sacrificing switching speed.

The disclosure is directed to transistors with fast switching speed and high breakdown voltage.

SUMMARY

Embodiments generally relate to semiconductor devices and methods for forming semiconductor device. In one embodiment, a method of forming a device is disclosed. The method includes providing a substrate defined with a device region. The method also includes forming a gate in the substrate. The gate includes a gate electrode, first and second gate dielectric layers in a trench having an upper trench portion and a lower trench portion. The method further includes forming a field plate in the trench and forming first and second diffusion regions. The gate is displaced from the second diffusion region.

In yet another embodiment, a semiconductor device is disclosed. The semiconductor device includes a substrate and a gate in the substrate. The gate includes a gate electrode, first and second gate dielectric layers in a trench having an upper trench portion and a lower trench portion. A field plate is disposed in the trench. The device includes first and second diffusion regions and the gate is displaced from the second diffusion region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1b show top and cross-sectional views of an embodiment of a device;

FIGS. 6a-6l show cross-sectional views of a process of forming another embodiment of a device.

DETAILED DESCRIPTION

Figure 2A:
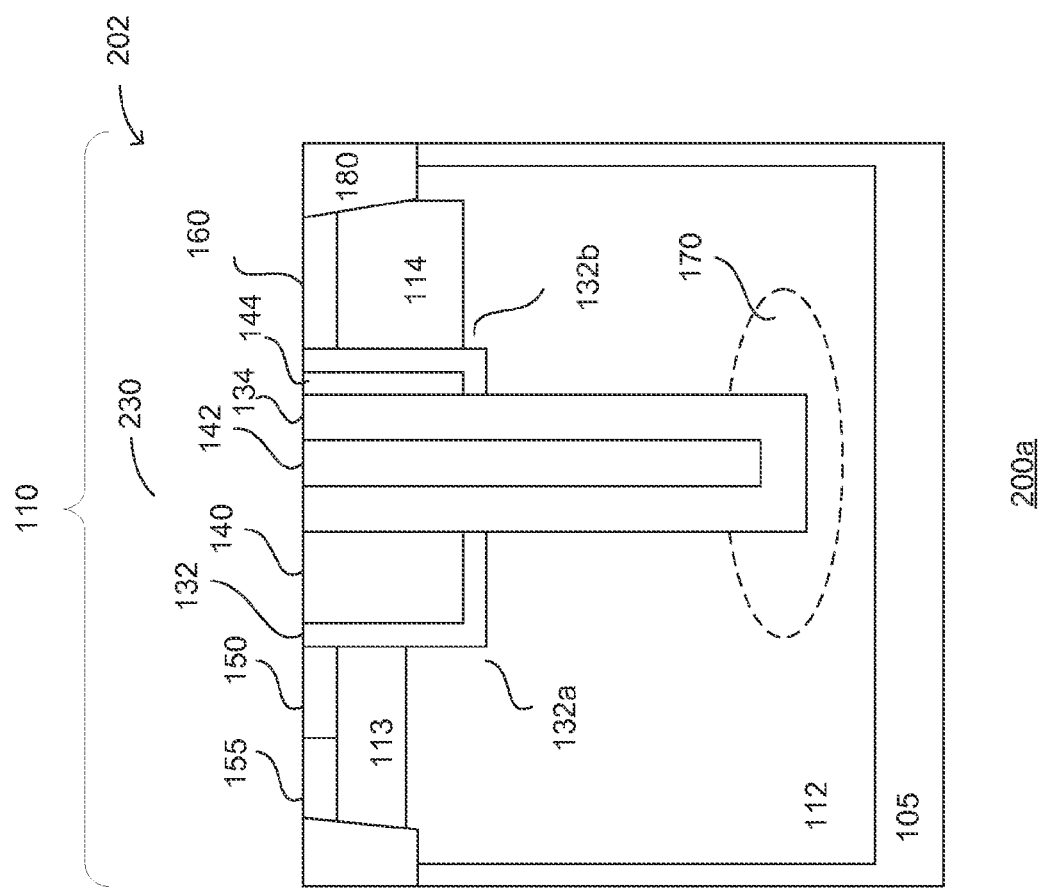
FIGS. 2a-2b show cross-sectional views of another embodiment of a device.

Embodiments generally relate to semiconductor devices. Some embodiments relate to devices, such as low power-loss buck and boost regulators, power amplifiers and power management circuits. Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

FIGS. 1a-1b show various views of a device 100. FIG. 1a shows a top view while FIG. 1b shows a cross-sectional view of the device along X-X'. Referring to FIGS. 1a-1b, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device includes a trench transistor 102 formed in a device region 110 defined on the substrate. A device isolation region 180 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for an STI region. Providing isolation regions which extend to other depths, such as 0.5-10 µm for DTI regions, may also be useful. In one embodiment, the width of the isolation region is about 0.1-0.8 µm. Providing isolation regions having different depths and widths may also be useful. The dimensions, for example, may depend on isolation requirements.

The device may include doped regions or wells having different dopant concentrations. For example, the device may include heavily doped, intermediate doped and lightly doped regions. The doped regions may be designated by $x^-$, x and $x^+$, where x indicates the polarity of the doping, such as p for p-type or n for n-type, and:

$x^-$=lightly doped;
x=intermediate doped; and
$x^+$=heavily doped.

A lightly doped region may have a dopant concentration of less than about $5E13/cm^3$. For example, a lightly doped region may have a dopant concentration of about $1E11$-$5E13/cm^3$. An intermediate doped region may have a dopant concentration from about $5E13$-$5E15/cm^3$. For a heavily doped region, it may have a dopant concentration of ore than about $5E15/cm^3$. For example, a heavily doped region may have a dopant concentration from about $5E15$-$5E19/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

In one embodiment, a first device doped well 112 is disposed in the substrate in the device region. The first device doped well, as shown, encompasses the complete device region. For example, the first device doped well extends from the bottom of the isolation region between inner and outer edges of the isolation region. Providing the first device doped well which is disposed the substrate from about an inner edge of the isolation region is also useful. In one embodiment, the first device doped well is a deep device doped well. The deep device doped well is sufficiently deep to accommodate the trench transistor. The deep device doped well, for example, extends to a depth of about 3-15 μm. Providing the deep device doped well of different depth may also be useful.

The deep device doped well includes first polarity type dopants. In one embodiment, the deep device doped well is lightly doped with first polarity type dopants. For example, the dopant concentration of the deep device doped well may be about $1E11$-$5E13/cm^3$. Providing a deep device doped well having other dopant concentrations may also be useful. In one embodiment, the first polarity type is n-type. For example, the deep device doped well may be n doped well for n-type device. Providing p-type as the first polarity type is also useful.

The transistor, in one embodiment, is a high voltage (HV) transistor. The transistor includes various components. For example, the transistor includes first and second diffusion or source/drain (S/D) regions 150 and 160, a field plate 142 and a gate 130. In one embodiment, the first diffusion region is a source region and the second diffusion region is a drain region.

In one embodiment, the various components of the transistor are disposed concentrically in the device region, as shown in FIG. 1a. The gate is disposed between the first diffusion region and the field plate. In one embodiment, the first diffusion region is disposed in the center of the device region and the others are disposed concentrically outwards. For example, the first diffusion region is the inner most component in the device region and the gate, field plate and second diffusion region are extending outwards concentrically in sequence. Other configurations of the transistor components may also be useful. For example, the transistor components may be disposed in a lateral configuration in the device region.

In one embodiment, the gate and field plate of the transistor are disposed in a trench formed in the substrate. The trench, in one embodiment, includes an upper trench portion and a lower trench portion. The gate and field plate, for example, is disposed in the trench below a surface of the substrate. For example, the gate is disposed in an upper trench portion and the field plate is disposed in the upper and lower trench portions. Providing a gate and field plate whose top surface is not coplanar with the substrate surface may also be useful. A top surface of the gate and field plate may be about coplanar with a top surface of the substrate. Illustratively, the cross-section includes first and second gates disposed in first and second trenches. For example, the cross-section shows first and second mirror halves of the transistor. The various components of the transistor may be arranged in a lateral configuration. Other configurations of the transistor may also be useful.

In one embodiment, the lower trench portion is narrower than the upper trench portion. As shown, inner and outer edges of the lower trench portion are recessed from inner and outer edges of the upper trench portion. In one embodiment, the depth of the trench is about 0.5-15 μm. For example, the upper trench portion is from the surface to about 0.5-5 μm while the lower trench portion is from about 3-15 μm. Providing upper and lower portions having other depths may also be useful. In one embodiment, the width of the upper trench portion is about 1-5 μm while the lower trench portion is about 2-4 μm. Providing upper and lower trench portions having other width may also be useful.

The gate includes a gate electrode 140 disposed in the upper trench portion. The gate electrode, in one embodiment, is formed of polysilicon. Other types of gate electrode materials may also be useful. For example, the gate electrode may be formed of tungsten (W).

The gate includes a first gate dielectric layer 132 disposed in the upper trench portion. In one embodiment, a first side 132a of the first gate dielectric layer lines an inner edge of the gate electrode adjacent to the first diffusion region, as well as a bottom of the gate electrode in the upper trench. For example, the first side of the first gate dielectric layer lines the inner edge of the gate electrode and wraps around to line the bottom of the gate electrode in the upper trench portion. The wrapping around of the gate electrode ensures that the gate electrode is insulated from the substrate. The first gate dielectric layer, in one embodiment, is formed of silicon oxide. For example, the first gate dielectric layer is formed of thermal silicon oxide. Other types of gate dielectric materials may also be useful. The first gate dielectric layer, for example, is a thin gate dielectric layer having a thickness of about 10-150 Å. Other gate dielectric thicknesses may also be useful. For example, the first gate dielectric thickness may depend on a maximum gate to source voltage ($V_{GS}$).

The gate includes a second gate dielectric layer 134. The second gate dielectric layer, in one embodiment, is formed of silicon oxide. For example, the second gate dielectric layer is formed of thermal silicon oxide. Other types of gate dielectric materials may also be useful. In one embodiment, the second gate dielectric layer is formed of the same material as the first gate dielectric layer. Providing first and second gate dielectric layers having different materials may also be useful. The second gate dielectric layer, for example, is a thick gate dielectric layer having a thickness of about 0.1-1 μm. Other gate dielectric thicknesses may also be useful. For example, the second gate dielectric thickness may depend on a maximum operation voltage $V_d$.

In one embodiment, the second gate dielectric layer isolates the field plate 142 from the gate electrode by wrapping around the field plate in the upper and lower trench portions. For example, the second gate dielectric layer lines the lower trench portion and isolates the gate electrode from the field plate in the upper trench portion.

In one embodiment, the field plate is disposed in the upper trench and lower trench portions, forming a vertical field plate. In one embodiment, the field plate is formed of polysilicon. Other types of materials may also be useful. For example, the field plate may be formed of tungsten (W). The field plate may be formed of the same materials as the gate electrode. Providing the field plate having different materials from the gate electrode may also be useful.

The gate electrode, in one embodiment, is displaced from the second diffusion region. For example, the gate electrode is displaced from the second diffusion region by the second gate dielectric layer, field plate and a second side 132b of the first gate dielectric layer.

In one embodiment, a residue portion 144 of the gate electrode is disposed in the upper trench portion adjacent to the second side of the first gate dielectric layer. For example, the residue portion is disposed between the second gate dielectric layer and the second side of the first gate dielectric layer adjacent to the second diffusion region. In one embodiment, the residue portion is formed of polysilicon. Other types of materials may also be useful. For example, the residue portion may be formed of tungsten (W). The residue portion may be formed of the same materials as the gate electrode. Providing the residue portion having different materials from the gate electrode may also be useful. Alternatively, in the case that the residue portion is formed of polysilicon, the residue portion may be oxidized to form silicon oxide. As such, the residue portion becomes part of the second side of the first gate dielectric layer. In such a case, the second side of the first gate dielectric layer is thicker than the first side of the first gate dielectric layer.

The first and second diffusion regions 150 and 160 are heavily doped regions in the substrate adjacent to the gate and field plate. In one embodiment, the first diffusion region is a source region and the second diffusion region is a drain region. The second diffusion region 160 is disposed, in one embodiment, adjacent to an outer edge of the upper trench portion and inner edge of the device isolation region. In one embodiment, the second diffusion region is a heavily doped region with first polarity type dopants. The dopant concentration of the second diffusion region may be from about $1E13-1E16/cm^3$. Other dopant concentrations for the second diffusion region may also be useful. For example, the second diffusion region may be n doped regions for an n-type device.

The second diffusion region, in one embodiment, is disposed in a second device doped well 114. The second device doped well includes first polarity type dopants. In one embodiment, the second device doped well is an intermediately doped well with first polarity type dopants. For example, the second device doped well is an n well for an n-type device. The dopant concentration of the second device doped well may be from about $1E12-1E15/cm^3$. Other dopant concentration for the second device doped well may also be useful. The second device doped well has a dopant concentration between the first device doped well and the second diffusion region.

The second device doped well, as shown, is disposed within the first device doped well. The second device doped well may have a depth greater than the device isolation region. For example, the second device doped well is from the top surface of the substrate to a bottom or below the bottom of the isolation region. Other depths may also be useful.

A third device doped well 113 is provided in the device region within the first device doped well. As shown, the third device doped well is disposed within the inner edges of the upper trench portion. For example, as shown by the cross-section, the third device doped well is disposed between inner edges of the upper trench portion. In one embodiment, the third device doped well is intermediately doped with second polarity type dopants. For example, the third device doped well has a dopant concentration of from about $1E12-1E15/cm^3$. Other dopant concentrations may also be useful. In the case of an n-type device, the third device doped well is a p well. The third device doped well serves as a body well for the transistor. The depth of the third device doped well, as shown is shallower than the upper trench portion. For example, the third device doped well is above a bottom of the gate electrode. The bottom of the third device doped well may be about 0.5-5 µm deep. Other depths may also be useful.

In one embodiment, the first diffusion region 150 is disposed in the third device doped well 113 and adjacent to the inner edges of the upper trench portion. For example, as shown by the cross-section, the first diffusion region is disposed between inner edges of the upper trench portion. The first diffusion region includes first polarity type dopants. In one embodiment, the first diffusion region is heavily doped with first polarity type dopants. The dopant concentration of the first diffusion region may be from about $1E13-1E16/cm^3$. Other dopant concentrations for the first diffusion region may also be useful. The first diffusion region, for example, may be $n^+$ doped regions for an n-type device. The depth of the first diffusion region is shallower than the third device doped well. For example, the first diffusion region may have a depth of about 0.05-0.3 µm. Providing first diffusion regions having other depths may also be useful. The first and second diffusion regions, for example, may be formed in the same process. In this case, the first and second diffusion regions may have similar characteristics.

In one embodiment, a body bias contact region 155 is provided to bias the body of the transistor. The body bias contact region, in one embodiment, is a heavily doped region with second polarity type dopants. For example, the body bias contact region has the same polarity type dopants as the third device doped well. The dopant concentration of the body bias contact region, for example, is from about $1E13-1E16/cm^3$. Other dopant concentrations may also be useful. The body bias region is disposed away from the gate. For example, the body bias contact region is disposed between the source regions of the gates. This separates the body bias contact region from the gate. The body bias contact and first diffusion regions are, for example, butt contact regions. In one embodiment, the body is biased with the same voltage as provided at the source.

A buried doped region 170 may be provided in the substrate within the first device doped well. As shown, the buried doped region surrounds a lower portion of the trench in which the field plate is formed. For example, the buried doped region surrounds the lower portion of the field plate and second gate dielectric layer in the lower trench portion. In one embodiment, the buried doped region is an intermediate doped region with first polarity type dopants. For example, the dopant concentration of the buried doped region may be from about 1E12-1E15/cm$^3$. In a case of an n-type device, the buried doped region may be an n doped region.

Contacts may be formed on the contact regions of the device, such as source and drain, gate, body bias contact regions and field plate contact region. In one embodiment, the contacts may be silicide contacts. Providing other types of contacts may also be useful.

A dielectric layer (not shown) may be disposed over the substrate. It is understood that there may be additional layers between the dielectric layer and the substrate, for example, an etch stop layer. The dielectric layer serves as an interlevel dielectric (ILD) layer. The dielectric layer may be, for example, silicon oxide. Other types of dielectric materials, such as doped SiO$_2$, Boron-doped Phophosilicate Glass (BPSG) or Borophosphosilicate Tetraethylorthosilicate Glass (BPTEOS), may also be useful for the ILD layer.

Interconnects (not shown), which include contacts and conductive lines, are provided in the ILD layer. The device may include multiple interconnect levels. The interconnects, for example, provide connections to the silicide contacts of the device.

The vertical field plate introduces vertical reduced surface (RESURF) effect in the drift region. As such, high breakdown voltage and low $R_{dson}$ can be obtained. Furthermore, the trench transistor with the vertical field plate results in a longer drift region without increasing surface area of the device. This allows the device to have a low gate-drain capacitance ($C_{dg}$). A low $C_{dg}$ greatly increases the performance of the device. For example, high switch speed can be achieved without sacrificing reliability (e.g., high $BV_{dss}$). In addition, the process of fabricating the trench transistor is compatible with current CMOS processes.

FIG. 2a shows a cross-sectional view of another embodiment of a device 200a. The device is similar to the device shown in FIG. 1b. Common elements may not be described or described in detail. The device includes a trench transistor 202 disposed in a device region 110 of a substrate 105. The components of the trench transistor are disposed in a lateral configuration. The device region includes a first device doped well 112. The first device doped well is a first polarity type doped well.

The transistor includes a gate 230, a first diffusion region 150, a second diffusion region 160 and a field plate 142. In one embodiment, the first diffusion region is a source region and the second diffusion region is a drain region. The source region is disposed adjacent to an inner edge of an upper trench portion and the drain region is disposed adjacent to an outer edge of the upper trench portion. In one embodiment, the source and drain regions are first polarity type doped regions. The drain region is disposed in a second device doped well 114. The second device doped well is a first polarity type well. The source region is disposed in a third device doped well 113. The third device doped well is a second polarity type well. In one embodiment, a body bias contact region 155 is disposed in the third device well along with the source region. The source and body bias contact regions are, for example, abutting each other. In one embodiment, the source region is adjacent to the inner edge of the upper trench portion and the body bias contact region is displaced from the first side 132a of the gate.

The gate and field plate are disposed in a trench formed in the substrate. The gate, in one embodiment, includes a gate electrode 140, first gate dielectric 132 and second gate dielectric 134. As shown, the gate electrode is displaced from the drain region by the second dielectric layer, field plate and a second side 1132b of the first gate dielectric. In one embodiment, the trench includes lower and upper portions. The lower trench portion is narrower than the upper trench portion. For example, inner and outer edges of the lower trench portion are recessed from inner and outer edges of the upper trench portion.

The first gate dielectric 132 lines an inner edge of the gate electrode adjacent to the source and wraps around to line a bottom of the gate electrode in the upper trench portion. As for the second gate dielectric layer 134, it isolates the field plate from the gate electrode. For example, the second gate electric layer wraps around the field plate in the upper and lower trench portions.

A buried doped region 170 may be provided in the substrate within the first device doped well. As shown, the buried doped region surrounds a lower portion of the trench in which the field plate is formed. For example, the buried doped region surrounds the lower portion of the field plate and second gate dielectric layer in the lower trench portion. The buried doped region serves as a drift well in the substrate. In one embodiment, the buried doped region is a first polarity type buried well. The trench transistor, as described, is compatible with current CMOS processes.

Figure 2B:
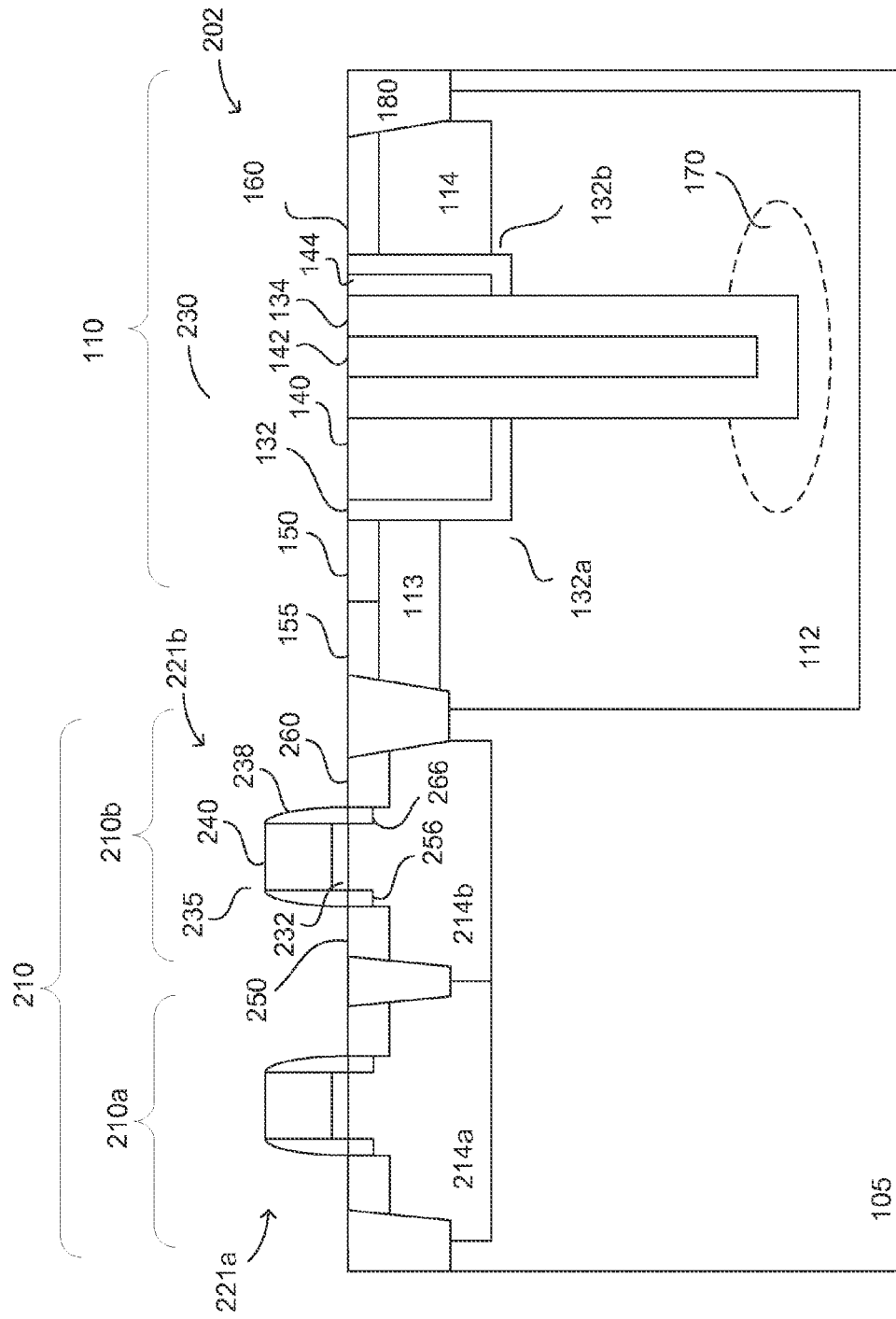

FIG. 2b shows a cross-sectional view of another embodiment of a device 200b. A semiconductor substrate 105 is provided. The substrate includes first and second device regions 110 and 210. The first device region is a high voltage (HV) device region and the second region is a low voltage (LV) device region. Although only HV and LV device regions are shown, it is understood that the device may include other device regions, for example, intermediate/medium voltage (MV) device region.

In one embodiment, the HV device region includes a trench transistor 202. The trench transistor, for example, is similar to that described in FIG. 2a. As such, common elements may not be described or described in detail. For example, the HV device region includes a first or HV device doped well 112. The first device doped well, in one embodiment, is a first polarity type doped well. The trench transistor includes a gate 230 with a first diffusion region 150, a second diffusion region 160 and a field plate 142. In one embodiment, the first diffusion region is a source region and the second diffusion region is a drain region. The source region is adjacent to an inner edge of an upper trench portion and the drain region is adjacent to an outer edge of the upper trench portion. The gate includes a gate electrode 140, first gate dielectric 132 and second gate dielectric 134. As shown, the gate electrode is disposed adjacent to the source and displaced from the drain by the second gate dielectric, field plate and a second side 132b of the first gate dielectric. The components of the trench transistor are disposed in a lateral configuration.

The HV device region is isolated from other device regions by, for example, an isolation region 180, such as an STI region. The LV device region is isolated from other device regions by an isolation region 180. The isolation region, for example, is a STI region.

In other embodiments, a LV device doped well (not shown) may be provided in the LV device region. In one embodiment, the LV device doped well is a second polarity type deep device doped well. The LV device well is a lightly doped second polarity type doped well. In other embodiments, the LV device doped well may be provided by an appropriately doped substrate. For example, in the case where the substrate is an appropriately doped substrate, a separate LV device doped well may not be needed. In the case where the LV device doped well is a p⁻ doped well, it may be provided by a p⁻ doped substrate.

As shown, the LV device region includes first and second transistor regions 210a-b. The first and second transistor regions include first and second transistor wells 214a-b for first and second transistors 221a-b. The transistor wells, for example, are intermediate doped wells. The transistor wells serve as bodies of the transistors. In one embodiment, the transistors are LV transistors.

A transistor includes a gate 235 having a gate electrode 240 and a gate dielectric 232. The gate dielectric, for example, is a thin gate dielectric for LV transistors. The gate dielectric may be a thermal silicon oxide with a thickness of about 10-150 Å. Other types of gate dielectric materials or thicknesses may also be useful. As for the gate electrode, it may be formed of polysilicon. Providing other types of gate electrode materials may also be useful. The gate electrode may have a thickness of about _1-4 µm. Other gate electrode thicknesses may also be useful. A transistor includes first and second source/drain (S/D) regions 250 and 260 adjacent to first and second sides of the gate. The S/D regions are heavily doped regions. The transistors may also include lightly doped drain (LDD) regions 256 and 266.

Gate dielectric sidewall spacers 238 may be included on the gate sidewalls. The spacers, for example, include silicon nitride. Other types of materials may also be used. For example, the spacers may be a silicon nitride or multiple layers of dielectric materials, such as silicon oxide and silicon nitride. A channel of the transistor is located in the substrate under the gate between the S/D regions.

In one embodiment, the first and second transistors are opposite polarity type transistors. For example, the first transistor is a first polarity type transistor and the second transistor is a second polarity type transistor. The first type may be n-type and the second type may be p-type. For example, n-type transistors include n-type S/D regions and p-type transistor wells while p-type transistors include p-type S/D regions and n-type transistor wells. The S/D regions may be similar to the source and drain regions of the HV transistor while the transistor wells may be similar to the second device doped well of the HV transistor.

Contacts may be firmed on the contact regions of the device. The contact regions include, for example, source, drain, field plate, S/D and body bias regions as well as gate electrodes. In one embodiment, the contacts may be silicide contacts. Providing other types of contacts may also be useful.

A dielectric layer (not shown) may be disposed over the substrate. It is understood that there may be additional layers between the dielectric layer and the substrate, such as for example, an etch stop layer. The dielectric layer serves as an interlevel dielectric (ILD) layer. The dielectric layer may be, for example, silicon oxide. Other types of dielectric materials, such as doped $SiO_2$, Boron-doped Phophosilicate Glass (BPSG) or Borophosphosilicate Tetraethylorthosilicate Glass (BPTEOS), may also be useful for the ILD layer.

Interconnects (not shown), which include contacts and conductive lines, are provided in the ILD layer. The device may include multiple interconnect levels. The interconnects, for example, provide connections to the silicide contacts of the device.

Figure 3A:
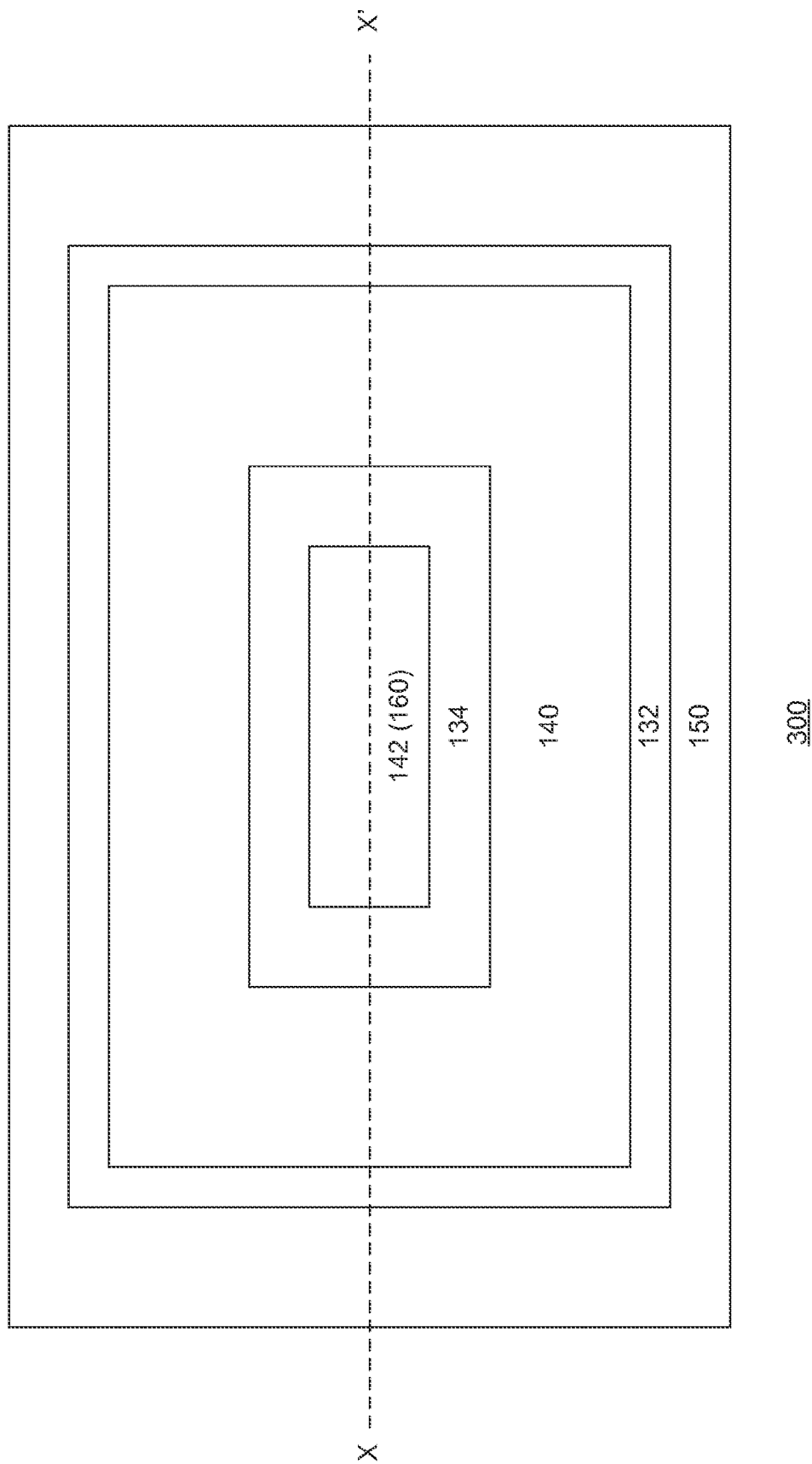
FIGS. 3a-3b show top and cross-sectional views of another embodiment of a device and FIG. 4 shows a cross-sectional view of the device with integrated HV and LV devices.
Figure 3B:
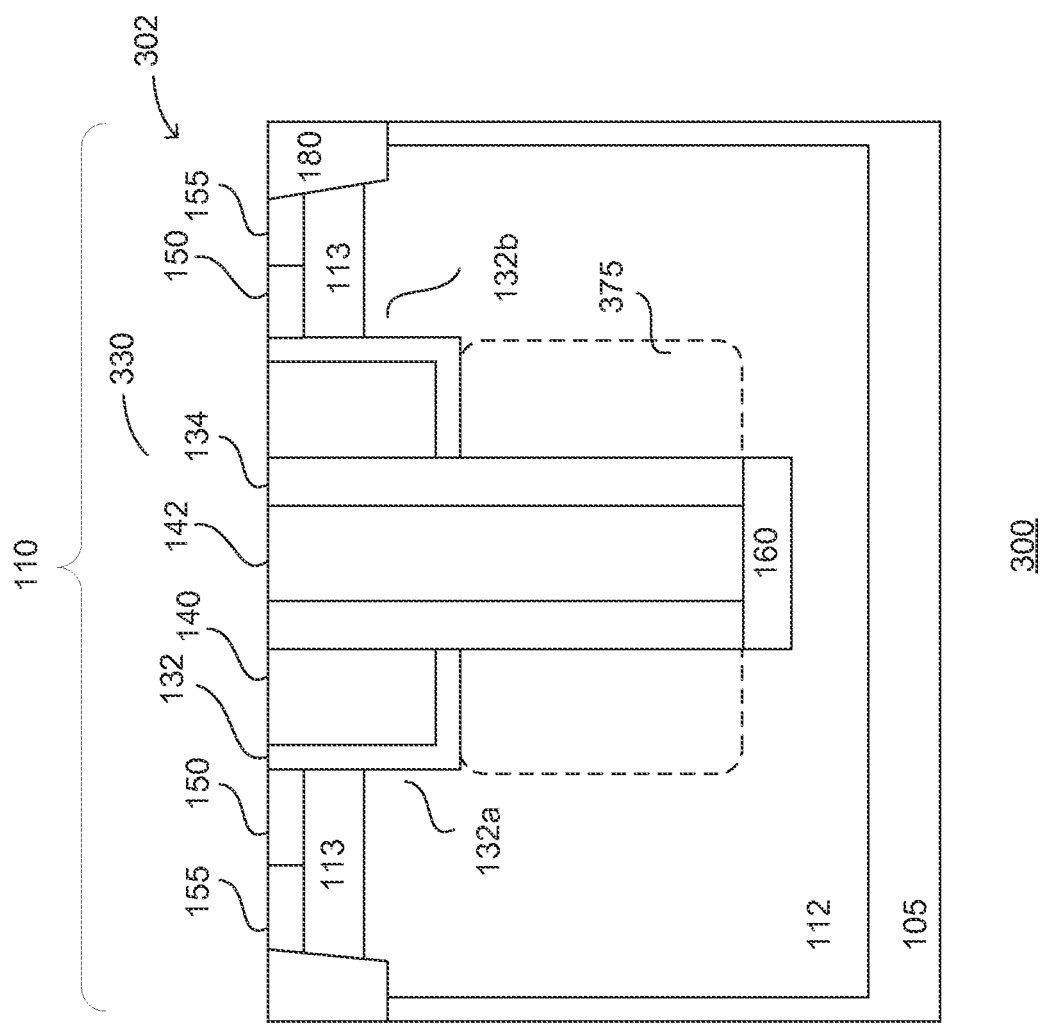

FIGS. 3a-3b show various views of another embodiment of a device 300. FIG. 3a shows a top view while FIG. 3b shows a cross-sectional view of the device along X-X'. The device is similar to the device shown in FIGS. 1a-1b. As such, common elements may not be described or described in detail. The device, as shown, includes a trench transistor 302 disposed in a device region 110 of a substrate 105. An isolation region 180 may be provided to isolate the device region from other device regions on the substrate.

The transistor includes various components. For example, the transistor includes a first diffusion region 150, a second diffusion region 160 and a gate 330. In one embodiment, the first diffusion region is a source region and the second diffusion region is a drain region. In one embodiment, the source and drain regions are heavily doped regions of first polarity type dopants.

The gate is disposed in a trench in the substrate. The trench includes an upper portion and a lower portion. In one embodiment, the lower trench portion is narrower than the upper trench portion. For example, inner and outer edges of the lower trench portion are recessed from inner and outer edges of the upper trench portion. In one embodiment, the gate is disposed in the upper trench portion.

The gate includes a first gate dielectric layer 132 and gate electrode 140 disposed in the upper trench portion. A first side 132a of the first gate dielectric layer lines a first edge of the gate electrode on a first side of the gate, as well as a first bottom of the gate electrode in the upper trench portion, while a second side 132b of the first gate dielectric lines a second edge of the gate electrode on the second side of the gate, as well as a second bottom of the gate electrode in the upper trench portion. For example, the gate dielectric lines the edges of the gate electrode and wraps around to line the bottom of the gate electrode in the upper trench portion.

In one embodiment, the various components of the transistor are disposed concentrically in the device region, as shown in FIG. 3a. In one embodiment, the drain is disposed in the center of the device region and the others are disposed concentrically outwards. For example, the drain is the inner most component in the device region and the gate and source are extending outwards concentrically in sequence.

The drain region is a heavily doped region disposed in the substrate below the lower trench portion, forming a buried drain region. For example, the drain region is disposed below the lower trench portion and within the first device doped well 112. In one embodiment, the drain region is vertically and laterally displaced from the gate. In one embodiment, the drain region is vertically and laterally displaced from the channel of the transistor. For example, the drain region includes vertical and lateral displacement components from the channel.

The lateral displacement facilitates providing a field plate 142 for accessing the drain region from the surface of the substrate. In one embodiment, the field plate is disposed in the trench. The field plate, for example, is disposed in the upper and lower portions of the trench, extending from the surface of the substrate to the drain region, forming a vertical field plate. In one embodiment, the field plate is formed of polysilicon. Other types of materials may also be useful. For example, the field plate may be formed of tungsten (W). The field plate may be formed of the same materials as the gate electrode. Providing the field plate having different materials from the gate electrode may also be useful.

The field plate and the gate electrode are isolated from each other by a second gate dielectric layer 134. In one embodiment, the second gate dielectric layer isolates the field plate from the gate electrode by wrapping around the field plate in the upper and lower trench portions. For example, the second gate dielectric layer lines the sidewalls of the lower trench portion and isolates the gate electrode from the field plate in the upper trench portion.

In one embodiment, a fourth device doped well 375 is provided in the device region within the first device doped well. For example, the fourth device doped well is disposed from about the bottom edge of the upper trench portion to about the bottom edge of the lower trench portion. In one embodiment, the fourth device doped well is a double-diffused drain (DDD) doped well. The fourth device doped well includes first polarity type dopants. In one embodiment, the fourth device doped well is an intermediately doped well with first polarity type dopants. For example, the fourth device doped well is an nDDD well for an n-type device. The dopant concentration of the fourth device doped well may be from about 1E12-1E15/cm³. Other dopant concentration for the fourth device doped well may also be useful. Providing an nDDD well improves hot carrier mobility and lowers the electric field within the gate and drain vicinity, which increases the device performance.

The source region is a heavily doped region disposed in the substrate adjacent to the gate. For example, the source region is disposed in the substrate adjacent to first and second sides of the gate. In one embodiment, the source region is disposed in a third device doped well 113. The source region, for example, is shallower than the third device doped well. Providing a source region having other depths may also be useful.

As shown by the cross sectional view, the third device doped well is disposed between the first and second edges of the upper trench portion and inner edges of the device isolation region. In one embodiment, the third device doped well is intermediately doped with second polarity type dopants. For example, the third device doped well has a dopant concentration of from about 1E12-1E14/cm³. Other dopant concentrations may also be useful. In the case of an n-type device, the third device doped well is a p well. The third device doped well serves as a body well for the transistor. The depth of the third device doped well, as shown is shallower than the upper trench portion. For example, the third device doped well is above the gate electrode. The bottom of the third device doped well may be about 0.5-2 μm deep. Other depths may also be useful.

In another embodiment, the transistor components are disposed in a lateral configuration in the device region. The transistor includes a drain disposed between first and second gates in a trench, and first and second source regions are disposed adjacent to the first and second gates. Illustratively, the transistor is formed of two devices being arranged side by side, sharing a drain region. The dual-gate configuration advantageously increases the operating current to about two folds without laterally increasing the device area. Other configurations of the transistor components may also be useful.

Figure 4:
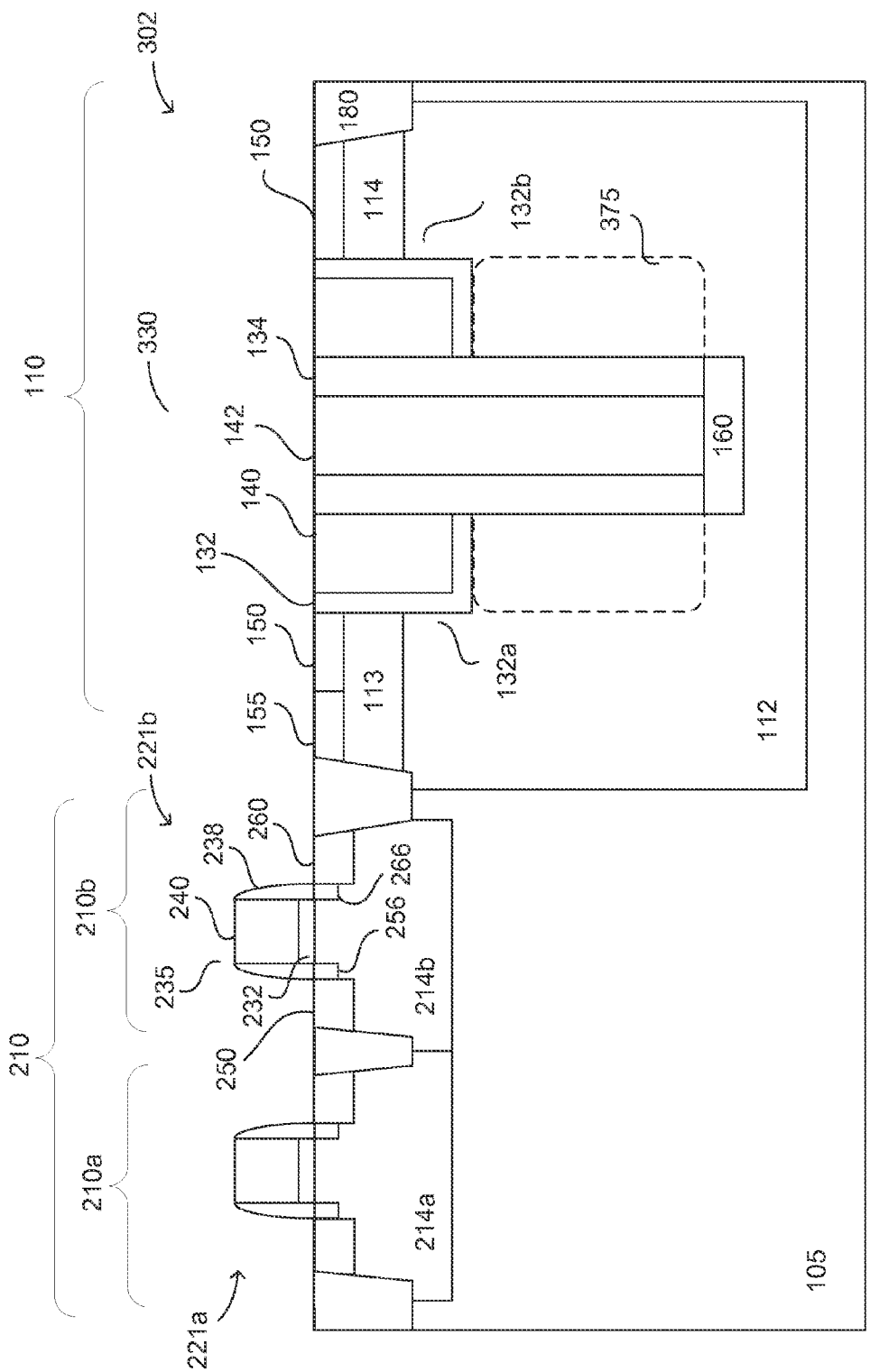

FIG. 4 shows a cross-sectional view of a device 400 with integrated HV and LV devices. A semiconductor substrate 105 is provided. The substrate includes first and second device regions 110 and 210. The first device region is a RV device region and the second region is a low voltage (LV) device region. Although only HV and LV device regions are shown, it is understood that the device may include other device regions. For example, the device includes an intermediate/medium voltage (NV) device region.

In one embodiment, the HV device region includes a trench transistor 302. The trench transistor, for example, is similar to that described in FIGS. 3a-3b. As such, common elements may not be described or described in detail. For example, the HV device region includes a first or RV device doped well 112. The first device doped well, in one embodiment, is a first polarity type deep device doped well. The trench transistor includes a gate 330 with a source region 150 and drain region 160. The source region is disposed in the substrate adjacent to the gate. For example, the source region is disposed in the substrate adjacent to first and second sides of the gate. The drain region is disposed in the substrate below the lower trench portion, forming a buried drain region. The buried drain region is vertically and laterally displaced from the gate. The components of the trench transistor are disposed in a lateral configuration. The HV device region is isolated from other device regions by, for example, an isolation region 180, such as an STI region.

The LV device region is isolated from other device regions by an isolation region 180. The LV device region is similar to the LV device region of FIG. 2b. As such, common elements may not be described or described in detail. A LV device doped well (not shown) may be provided in the LV device region. In one embodiment, the LV device doped well is a second polarity type deep device doped well. First and second transistor regions 210a-b with first and second transistors 221a-b are provided. The transistors, for example, are LV transistors.

Figure 5A:
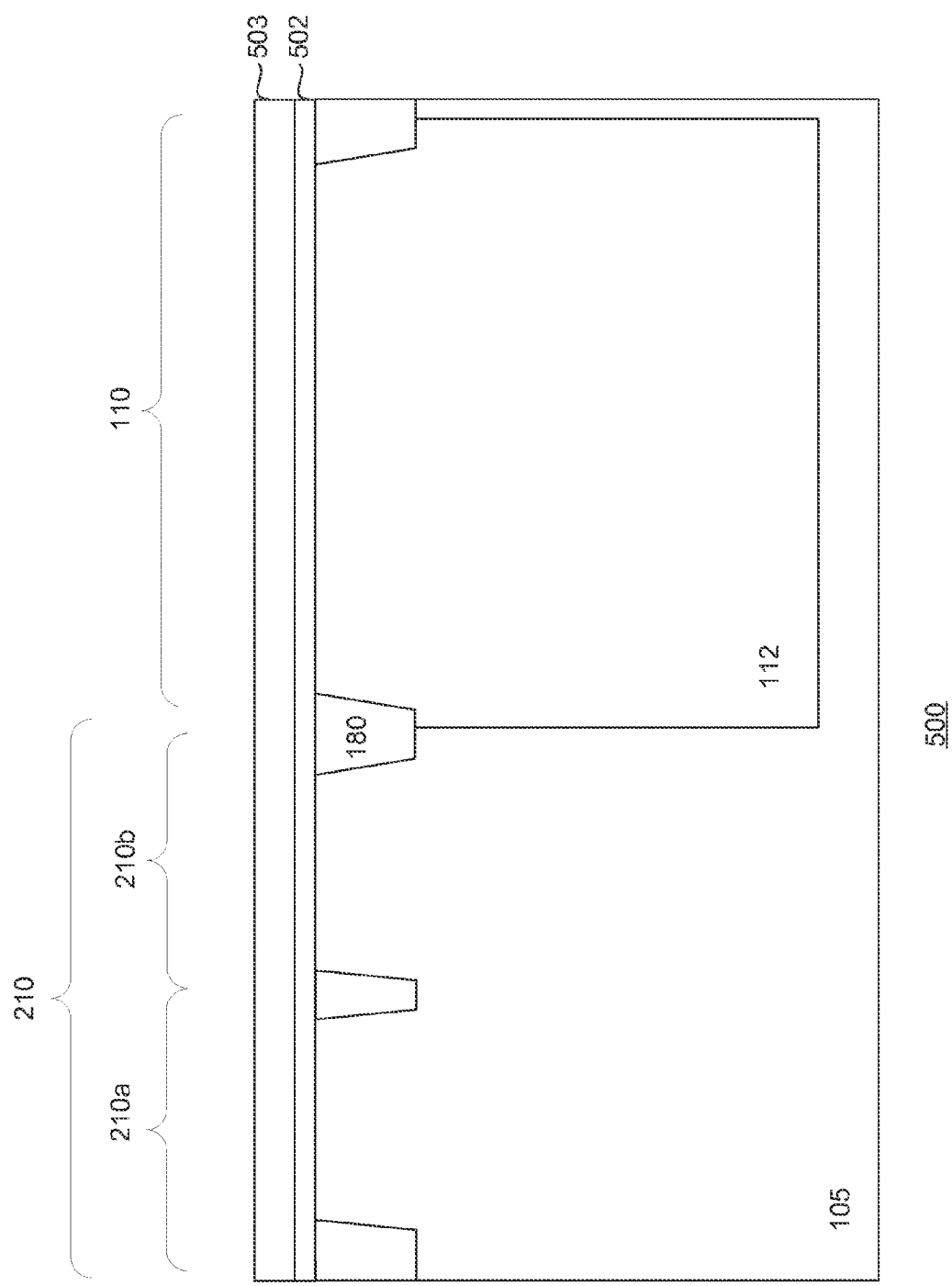
FIGS. 5a-5q show cross-sectional views of a process of forming an embodiment of a device.

FIGS. 5a-5q show cross-sectional views of an embodiment of a process 500 for forming a device or IC. Referring to FIG. 5a, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

As shown in FIG. 5a, a HV device region 110 and a LV device region 210 are defined on the substrate. It is understood that the substrate may include other types of regions. For example, the substrate may include other device regions for other types of devices. Furthermore, it is understood that a region may include additional regions or sub-regions. For example, the LV device region is shown to include first and second sub-regions 210a-b.

A device isolation region 180 may be provided to isolate a device region from other regions. For example, device isolation regions may be provided to isolate the HV and LV device regions and sub-regions. The isolation regions, for example, are shallow trench isolation (STI) regions. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI regions. Other types of isolation regions may also be employed. For example, the isolation region may be a deep trench isolation (DTI) region. The depth of the STI regions may be, for example, about 0.1-0.5 μm. Other depths for the STI regions may also be useful.

A first device doped well 112 is provided in the HV device region. In one embodiment, the first device doped well is a deep device doped well. The first device doped well in the HV device region serves as a drift well for a trench transistor. The depth of the first device doped well, for example, may be about 3-5 μm. Providing first device doped well of other depths may also be useful. Providing first device doped well of different depths in the HV device region may also useful. The first device doped well, in one embodiment, is doped with first polarity type dopants for a first polarity type trench transistor. For example, an n-type first device doped well is provided for an n-type trench transistor. Forming a p-type first device doped well for a p-type trench transistor may also be useful. In one embodiment, the first device doped wells are lightly doped wells. Other dopant concentrations for the first device doped wells may also be useful.

The LV device region, may be provided with a LV device doped well (not shown). The LV device doped well may be a second polarity type deep device doped well. In one embodiment, the LV device doped well is lightly doped with second polarity type dopants. The LV device doped well may encompass the LV device region, serving as an isolation well. In other embodiments, the LV device doped well may be provided by the substrate. For example, if the substrate is appropriately doped, no separate LV device doped well needs to be provided. This is because the substrate may serve as the LV device doped well.

To form deep device doped wells, an implant mask which exposes the device regions is used. The implant mask, for example, is a photoresist layer which is patterned. The implant mask may be patterned using lithographic techniques. Since the device isolation region can serve as an implant mask, this allows for increased processing window for the patterning process to form the implant mask. Dopants are implanted into the substrate using the implant mask. The dopants are implanted with the appropriate dose and power. In some embodiments, deep device doped wells may be formed by, for example, performing multiple implants at different energies. Separate polarity type deep device doped wells are formed using separate implant processes with separate implant masks.

An anneal is performed. In one embodiment, the anneal is performed after the deep device doped wells are formed. The anneal diffuses the dopants from the implant, forming the deep device doped wells which extend to under the bottom of the device isolation region. In other embodiment, separate anneal may be performed for the deep device doped wells in the HV and LV device regions. For example, an anneal may be performed for the individual deep device doped wells to obtain different depths of the deep device doped wells.

The isolation regions, for example, may be formed prior to forming the deep device doped wells. In other embodiments, the isolation regions may be formed after forming the deep device doped wells. Other configurations of forming the isolation regions and deep device doped wells may also be useful.

A hard mask 503 is formed on the surface of the substrate. The hard mask is used to pattern the substrate. For example, the hard mask is used to etch a trench in the substrate in which a gate and a field plate of a trench transistor are disposed. The hard mask, in one embodiment, is a single layer hard mask. Providing a multilayer hard mask stack may also be useful. For example, the multilayer hard mask stack includes first and second hard mask layers. The first and second hard mask layers include materials which can be removed selectively to each other. In one embodiment, the hard mask layer is silicon nitride. Other types of hard mask may also be useful. In one embodiment, the hard mask may be about 200-3000 Å thick. Other thicknesses for the hard mask are also useful. For example, the thickness for the hard mask may be selected based on design requirements. A pad layer 502 may be provided beneath the hard mask. The pad layer, for example, may be silicon oxide. The pad layer may serve to improve adhesion of the hard mask to the substrate. The pad layer, for example, may be about 50-500 Å thick. Other types of hard mask or combination of hard mask and pad layers may also be useful.

Figure 5B:
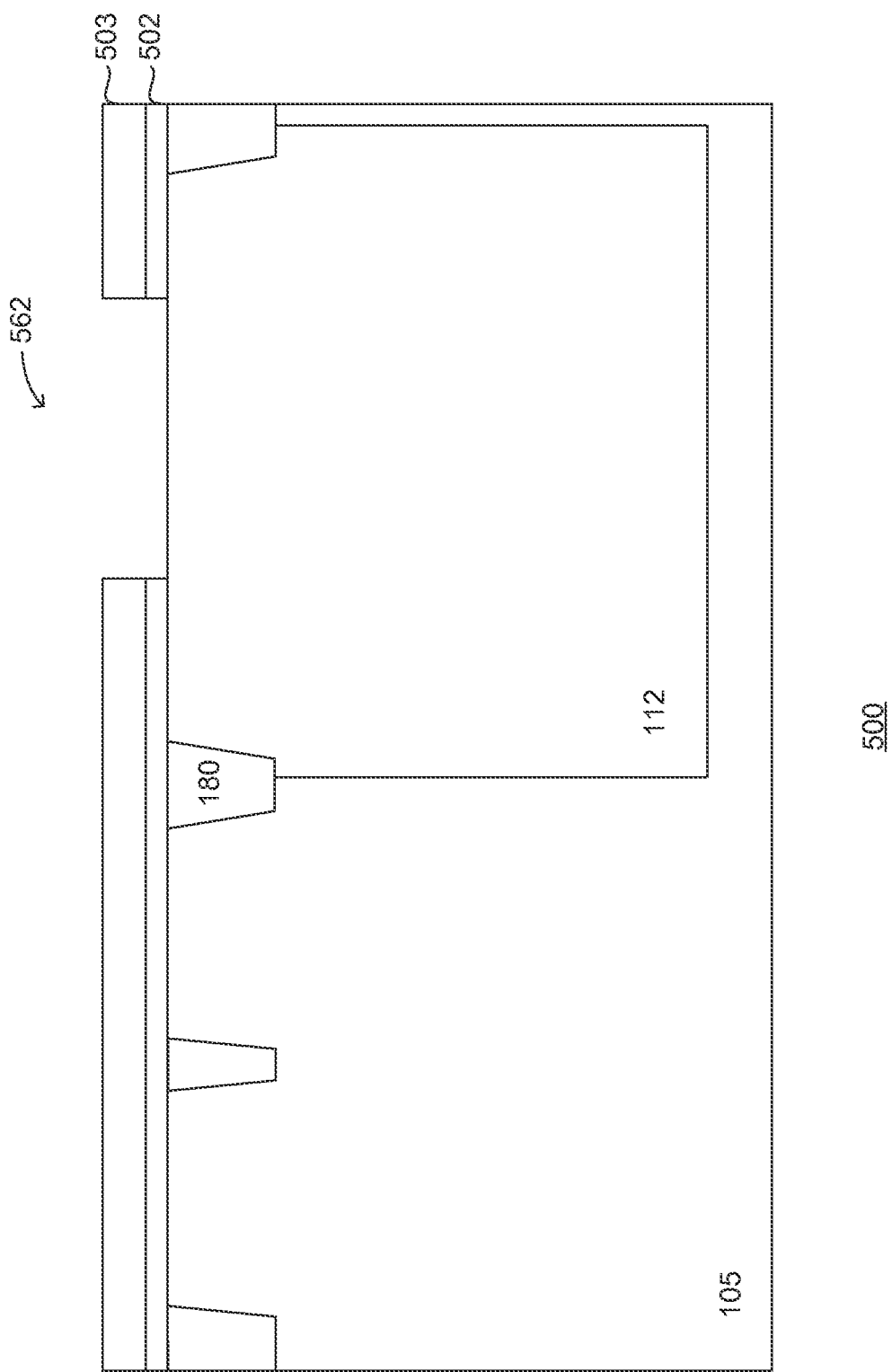

Referring to FIG. 5b, the hard mask is patterned to form an opening 562. The opening corresponds to a trench in which a gate and a field plate of a transistor are formed. Patterning of the opening may be achieved using mask and etch techniques. For example, a soft mask, such as photoresist, may be selectively patterned to create an opening to expose a portion of the hard mask corresponding to the opening. An anisotropic etch, such as a reactive ion etch (RIE), may be performed to remove the exposed portions of the hard mask, including the pad layer, to form the opening. This exposes the substrate surface in the opening. To improve lithographic resolution, an anti-reflective coating (ARC) layer (not shown) can be provided beneath the photoresist. Other techniques for patterning the hard mask may also be useful. After patterning the hard mask, the mask, including the ARC layer may be removed.

Figure 5C:
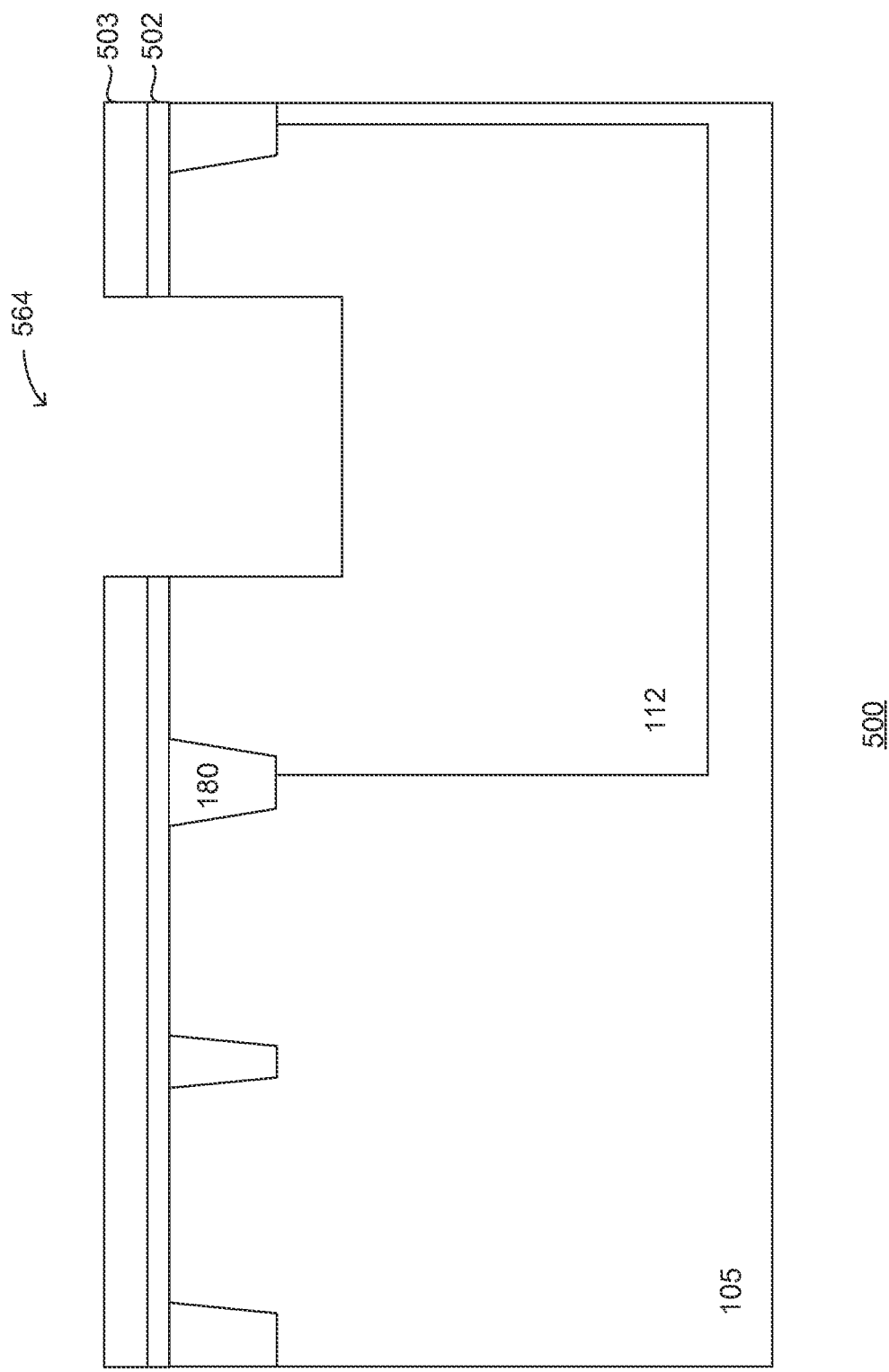

Referring to FIG. 5c, an upper portion of a trench 564 is formed in the substrate. In one embodiment, the trench is formed by a reactive ion etch (RIE), using the hard mask as an etch mask. The trench formed has a depth from the surface of the substrate. The depth, for example, may be about 0.5-5 μm below the surface of the substrate. Other depths may also be useful. The depth, for example, is determined by the requirements of operative voltage.

The exposed trench walls may be cleaned. For example, the trench walls are cleaned to remove any surface damage from the RIE etch. In one embodiment, the cleaning of the trench walls is performed by exposure to hydrogen plasma. Other techniques for cleaning the trench sidewalls may also be useful. A thermal process, such as thermal oxidation, is carried out to deposit an oxide layer on the trench walls. The oxide layer is subsequently removed, for example, by wet etch.

Figure 5D:
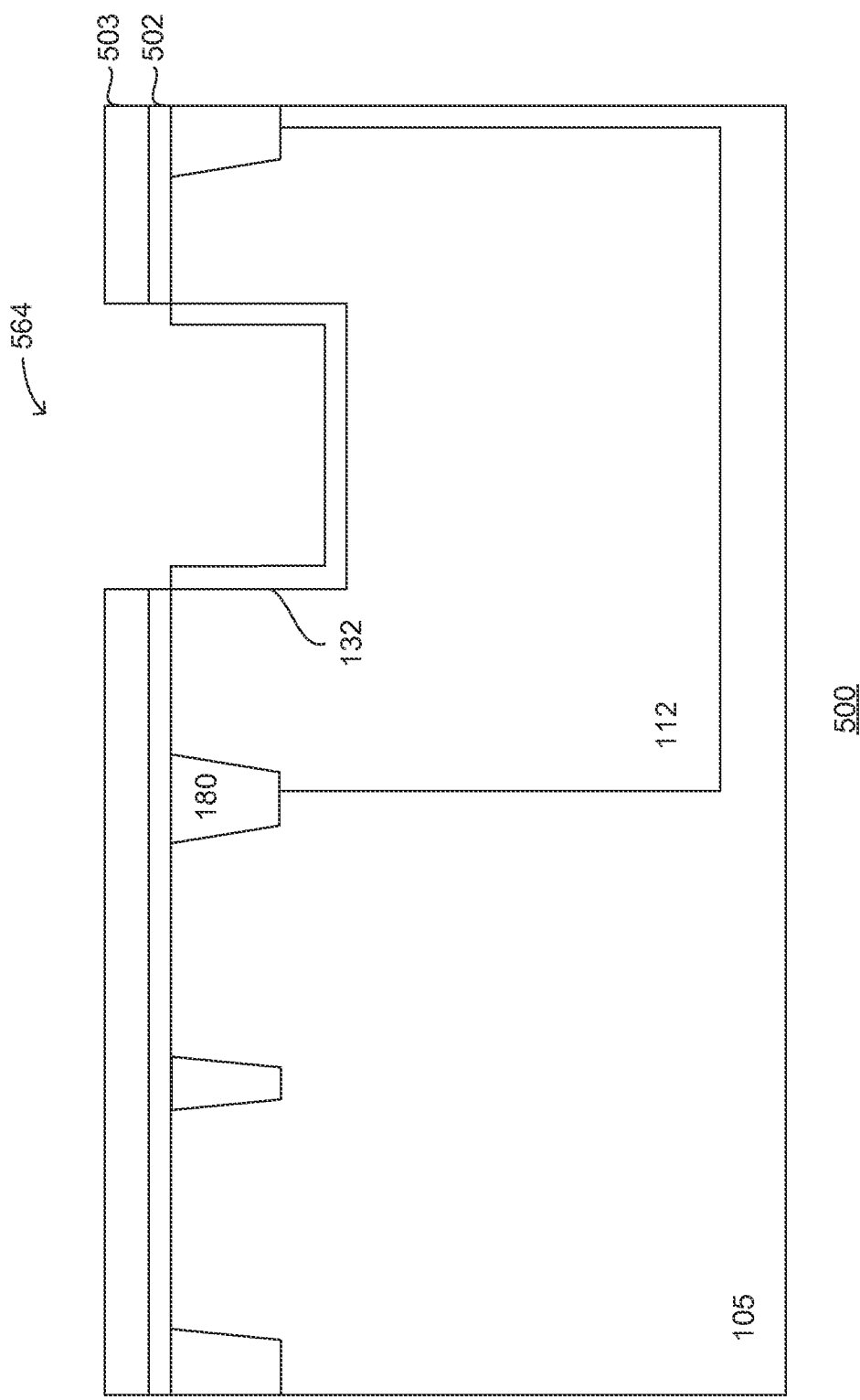

As shown in FIG. 5d, a first gate dielectric layer 132 is formed on the exposed trench walls. The first gate dielectric layer, in one embodiment, is silicon oxide. Other types of gate dielectric materials may also be useful. The first gate dielectric layer, in one embodiment, is formed by thermal process, such as thermal oxidation. For example, the first gate dielectric layer is formed by a wet oxidation followed by annealing the substrate in an oxidizing ambient. The temperature of the wet oxidation can be, for example, about 850-1050° C. The annealing can be, for example, performed at a temperature of about 850-1050° C. Alternatively, the first gate dielectric layer may be formed by a partial wet oxidation. The thermal process selectively forms the first gate dielectric layer on the exposed trench walls. Other techniques for forming the first gate dielectric layer may also be useful. The thickness of the first gate dielectric layer may be about 10-150 Å. Other thicknesses for the first gate dielectric layer may also be useful.

Figure 5E:
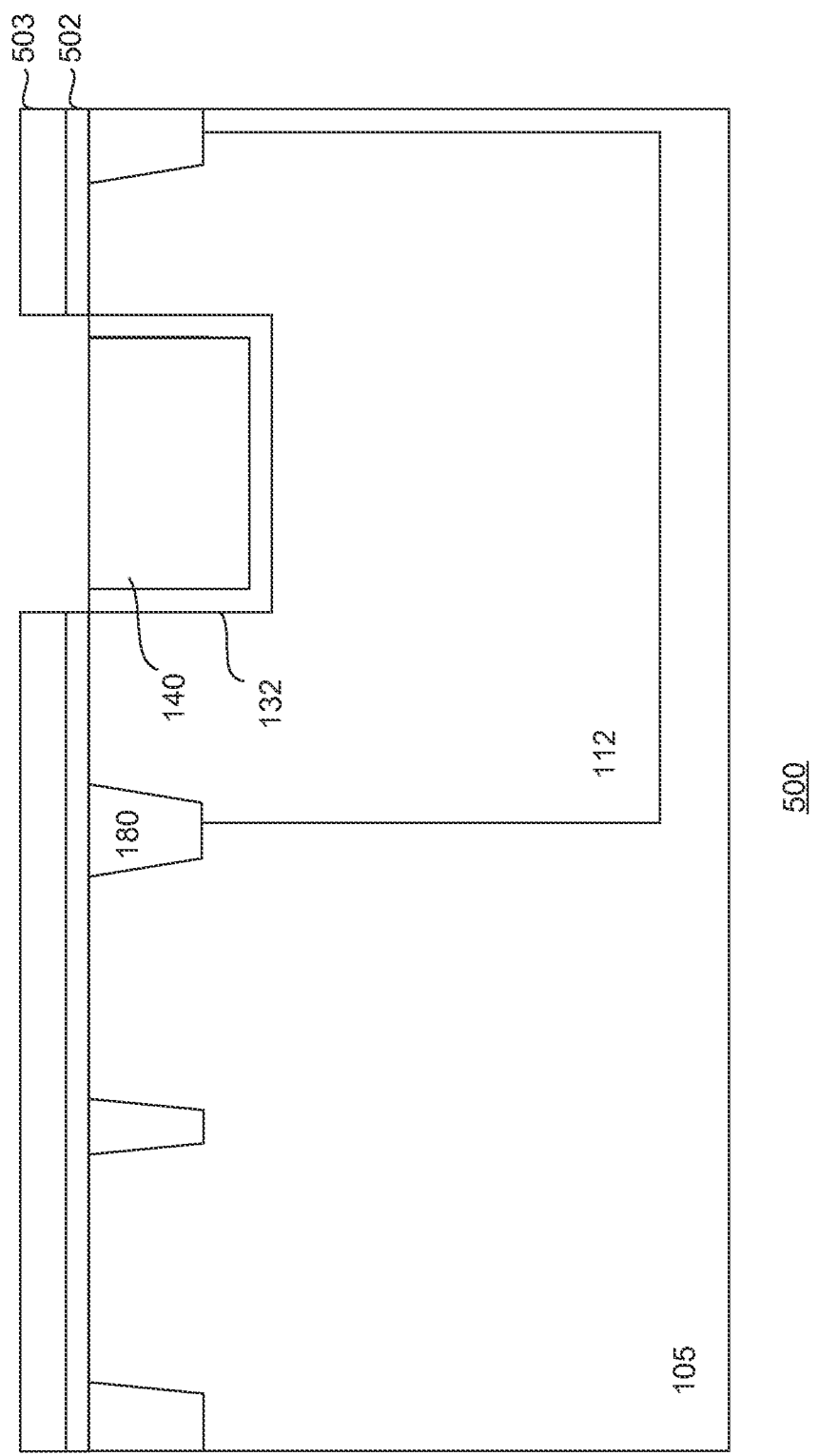

Referring to FIG. 5e, a gate electrode layer 140 is formed on the substrate. The gate electrode layer fills the trench. In one embodiment, the first gate dielectric layer surrounds the gate electrode layer in the trench. The gate electrode layer, in one embodiment, is polysilicon. Other types of gate electrode material may also be useful. For example, the gate electrode layer may be formed of tungsten. The gate electrode layer may be formed by CVD. Other techniques of forming the gate electrode layer may also be useful.

A planarization process is performed to remove excess material of the gate electrode layer. In one embodiment, the planarization process includes a polishing process, such as chemical mechanical polishing (CMP). Alternatively, the excess material of the gate electrode layer is removed by an etch back process. Other types of planarization processes may also be useful to remove the excess gate electrode material. In one embodiment, an over-polish is performed to recess the top surface of the gate electrode layer below the surface of the hard mask. In one embodiment, top surface of the gate electrode is recessed below a top surface of the hard mask layer.

As shown in FIG. 5f, the hard mask is removed. In one embodiment, the hard mask is removed by a wet etch. For example, the hard mask is removed by a wet etch using a chemistry which selectively removes the hard mask material. Other techniques for removing the hard mask may also useful.

After the removal of the hard mask, oxidation is performed to form a layer of oxide on the top surface of the gate electrode layer. The oxidation, in one embodiment, is a thermal oxidation. In one embodiment, the oxide layer has a top surface which is co-planar with a top surface of the pad layer.

Figure 5G:
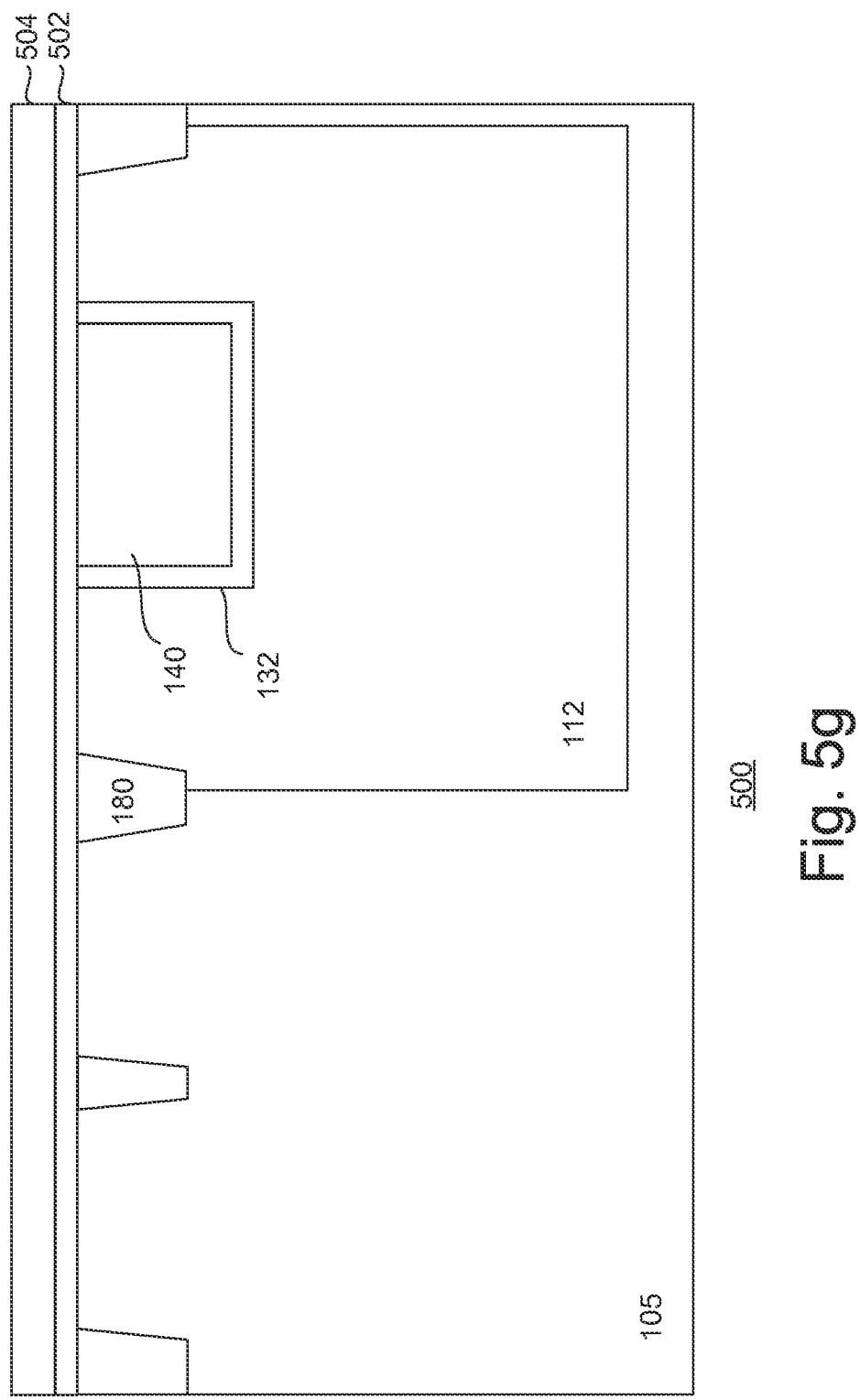

Referring to FIG. 5g, a sacrificial layer 504 is formed on the substrate, covering the pad layer. The sacrificial layer, in one embodiment, is silicon nitride. Other types of sacrificial materials may also be useful. The thickness of the sacrificial layer may be about 500-5000 Å. Other thicknesses for the sacrificial layer may also be useful. The sacrificial layer, for example, may be formed by chemical vapor deposition (CVD). Other techniques for forming the sacrificial layer may also be useful.

Figure 5H:
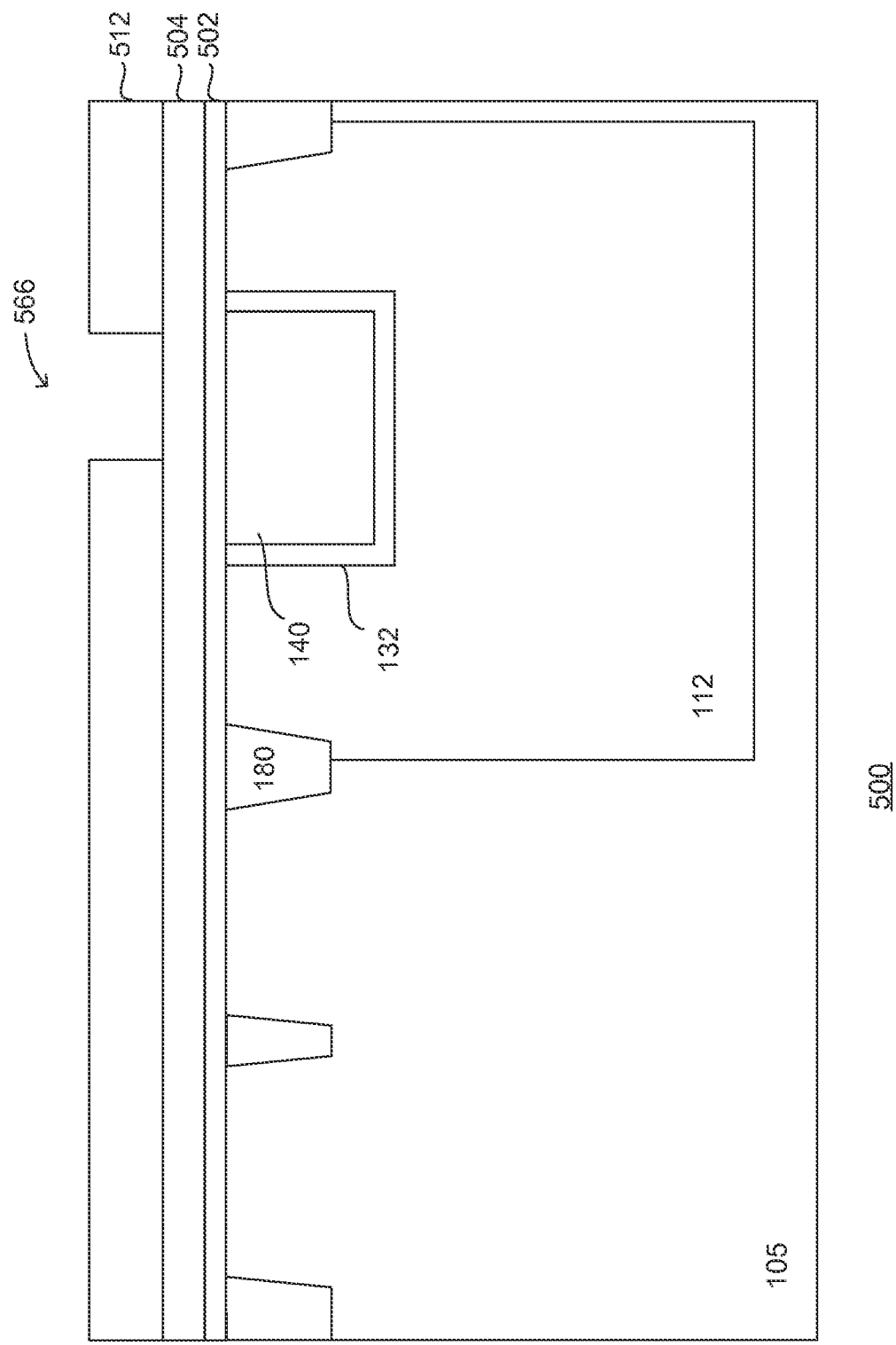

As shown in FIG. 5h, a soft mask 512 is formed on the substrate. The soft mask, as shown, is selectively patterned to create an opening 566. The soft mask, for example, is firmed of a photoresist. The soft mask serves as an etch mask to remove the exposed portion of the sacrificial layer, pad layer and substrate. The etch, for example, is a RIE.

Figure 5I:
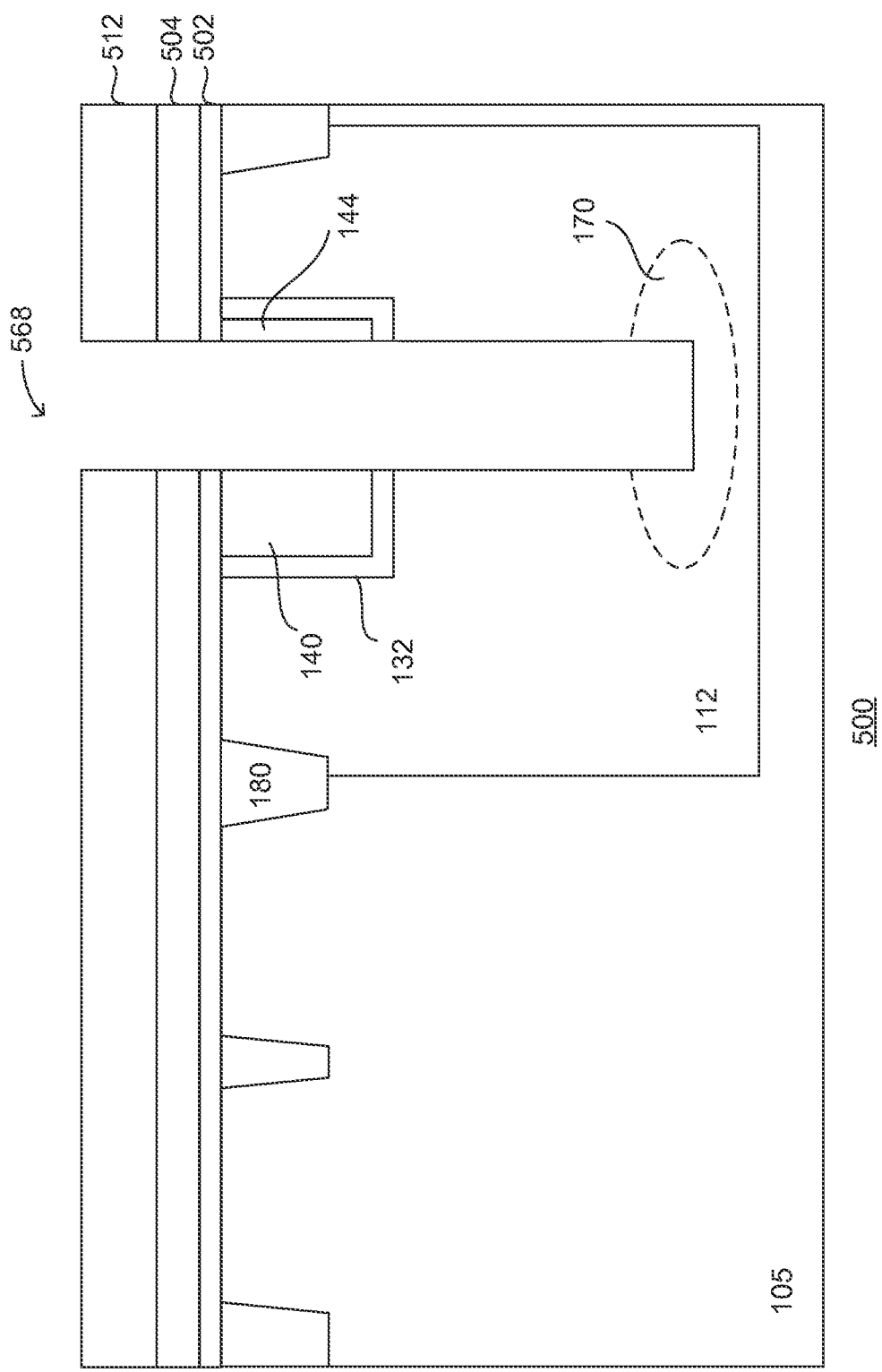

Referring to FIG. 5i, the substrate is etched, for example, by an RIE using the soft mask as an etch mask. The etch forms a trench 568 in the substrate. In one embodiment, the etch defines the gate electrode 140 and a residue portion 144. The depth of the trench, for example, is about 3-15 µm from the surface of the substrate. Other depths of the trench may also be useful. The depth, for example, is determined by the requirement of the operative voltage. In one embodiment, the depth of the trench is shallower than the depth of the HV device doped well 112. For example, the trench is substantially disposed with the HV device doped well.

The exposed trench sidewalls, for example, are cleaned. For example, the trench sidewalls are cleaned to remove any surface damage from the RIE etch. In one embodiment, the cleaning of the trench sidewalls is performed by exposure to hydrogen plasma. Other techniques for cleaning the trench sidewalls may also be useful. A thermal process, such as thermal oxidation, is carried out to deposit an oxide layer on the trench sidewalls. The oxide layer is subsequently removed, for example, by wet etch.

Dopants are implanted into the substrate. In one embodiment, first polarity type dopants are implanted into the substrate. The implant forms a doped region below the bottom of the trench, using the soft mask as an implant mask. An anneal is performed to diffuse and activate the dopants to form a buried doped region 170 as shown in FIG. 5i. The buried doped region, in one embodiment, surrounds the bottom of the trench. In one embodiment, the buried doped region is an intermediate doped region with first polarity type dopants. For example, the buried doped region may be an n doped region for an n-type device. The dopant concentration, for example, may be from about 1E12-1E15/cm$^3$. Forming a buried doped region with other dopant concentrations may also be useful. The implant energy can be carried out at energy in the range of, for example, approximately 50-150 KeV. Other implant energies and/or doses may be used to form the buried doped region.

Figure 5J:
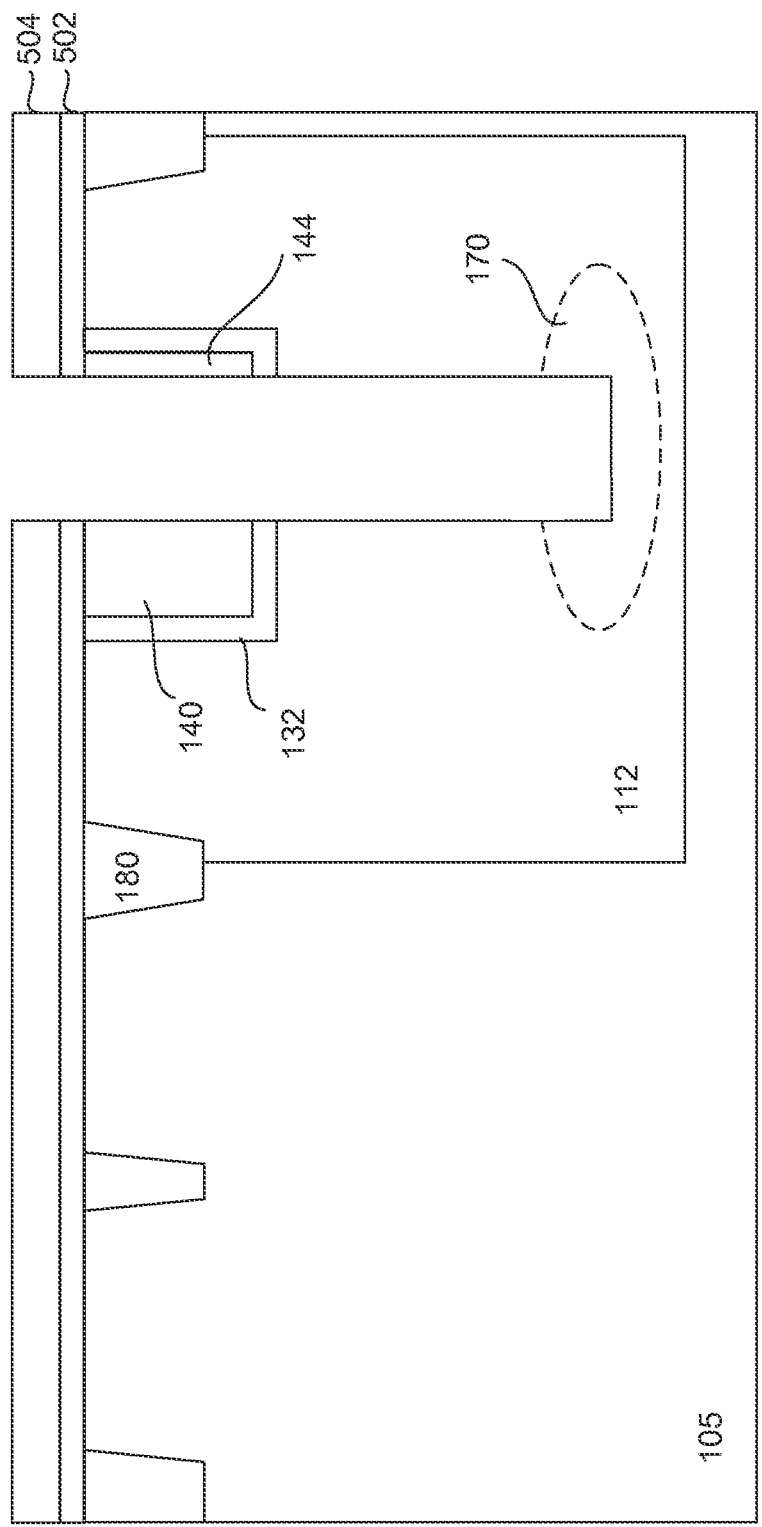

Referring to FIG. 5j, the soft mask is removed. The soft mask, for example, may be removed by wet etch. Other techniques for removing the soft mask may also be useful.

Figure 5K:
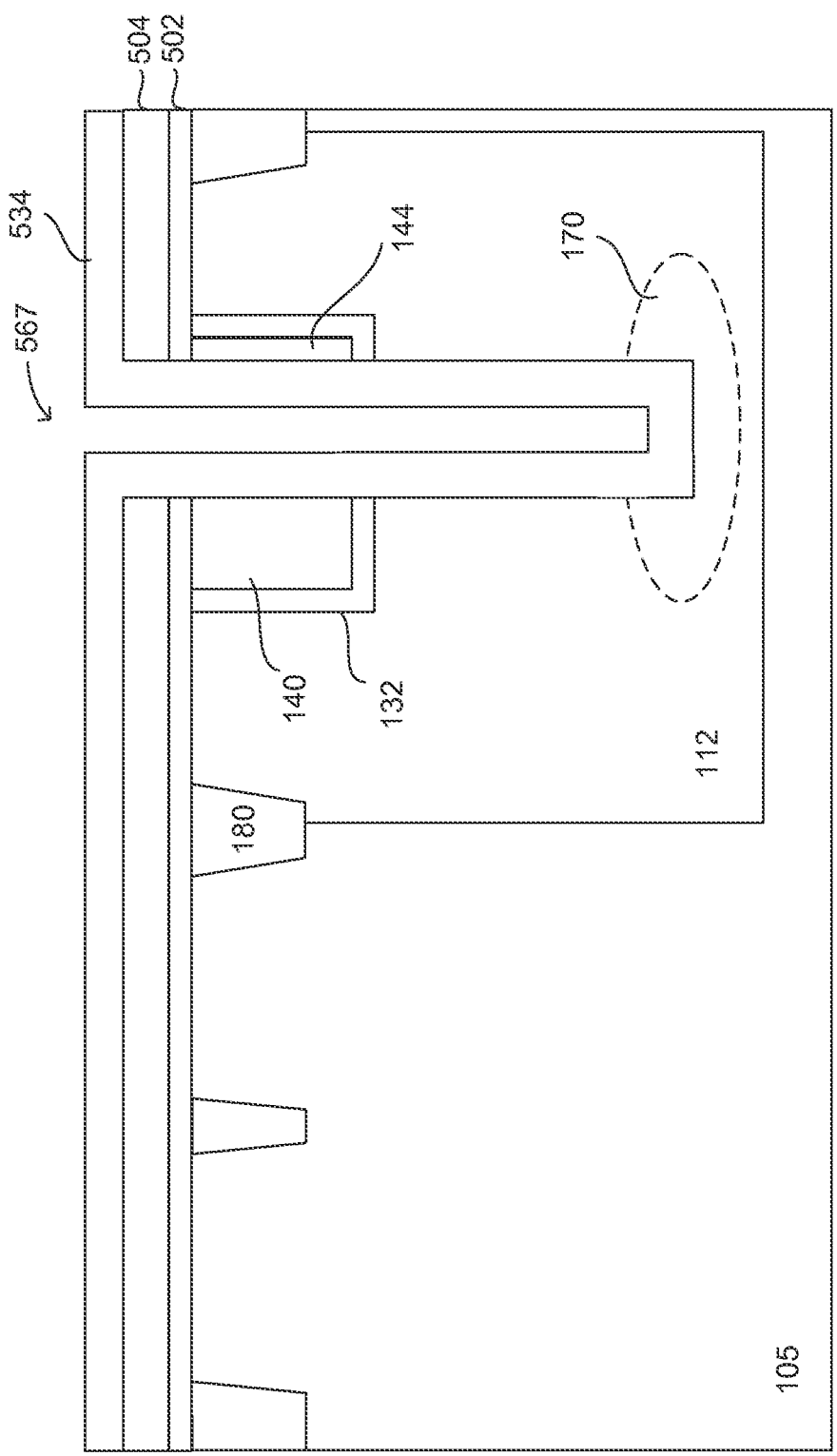
Figure 5I:
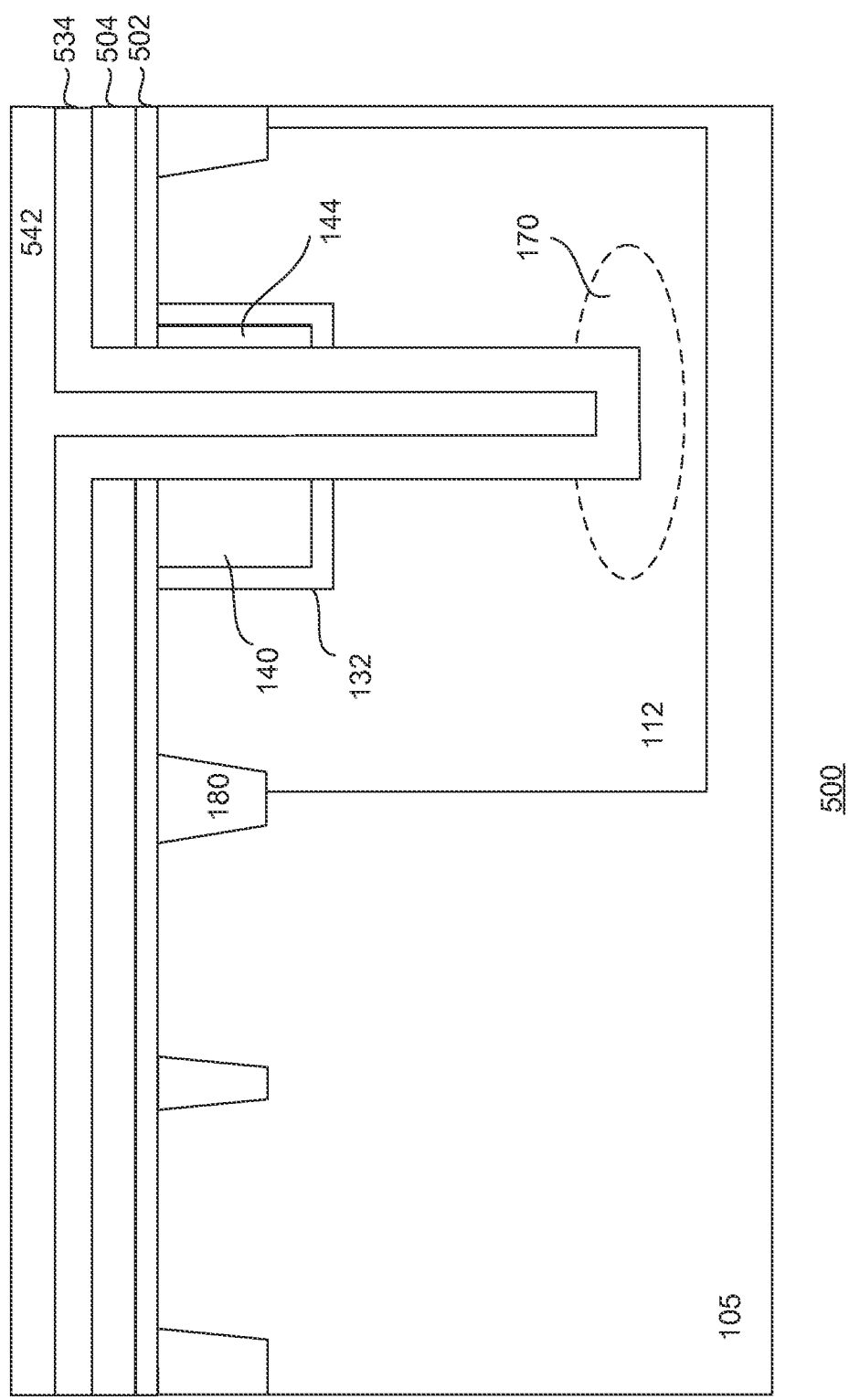

As shown in FIG. 5k, a second gate dielectric layer 134 is formed on the exposed portion of the trench sidewalls and bottom. In one embodiment, the second gate dielectric layer lines the exposed portion of the trench sidewalls and bottom, leaving a gap 567 in the trench. The gap corresponds to a trench in which a field plate of a transistor is formed. The second gate dielectric layer, in one embodiment, is silicon oxide. Other types of gate dielectric materials may also be useful. The second gate dielectric layer, in one embodiment, is formed by a thermal process, such as thermal oxidation. For example, the second gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the second gate dielectric layer may be formed by a partial wet oxidation. The thermal process selectively forms the second gate dielectric layer on the exposed trench sidewalls. Other techniques for forming the second gate dielectric layer may also be useful. The thickness of the second gate dielectric layer may be about 0.1-1 µm. Other thicknesses for the second gate dielectric layer may also be useful.

Referring to FIG. 5l, a field plate layer 542 is formed on the substrate. The field plate layer fills the gap in the trench and covers the substrate. In one embodiment, the second gate dielectric layer lines the lower portion of the trench and isolates the gate electrode from the field plate in the upper trench portion. The field plate layer, in one embodiment, is polysilicon. Other types of field plate material may also be useful. For example, the field plate layer may be formed of tungsten (W). The field plate layer may be formed by CVD. Other techniques of forming the field plate layer may also be useful.

Figure 5M:
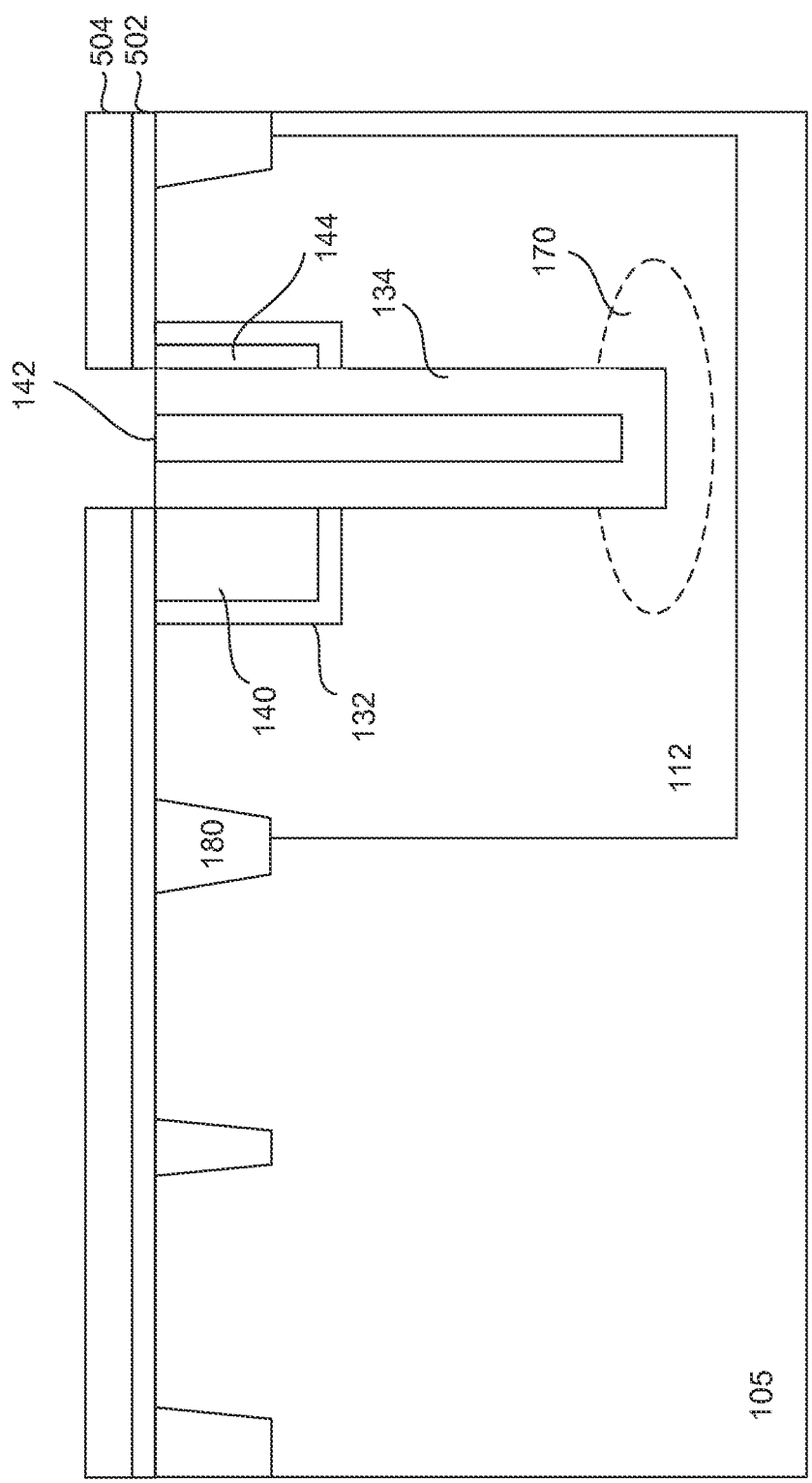

Referring to FIG. 5m, a planarization process is performed to remove excess materials of the second gate dielectric layer and field plate layer. In one embodiment, the planarization process includes a polishing process, such as chemical mechanical polishing (CMP). Alternatively, the excess materials of the second gate dielectric layer and field plate layer are removed by an etch back process. Other types of planarization processes may also be useful to remove the excess materials. In one embodiment, an over-polish is performed to recess the top surface of the second dielectric layer and field plate layer below the surface of the sacrificial layer. In one embodiment, top surface of second dielectric layer and field plate layer is recessed below a top surface of the sacrificial layer.

Figure 5N:
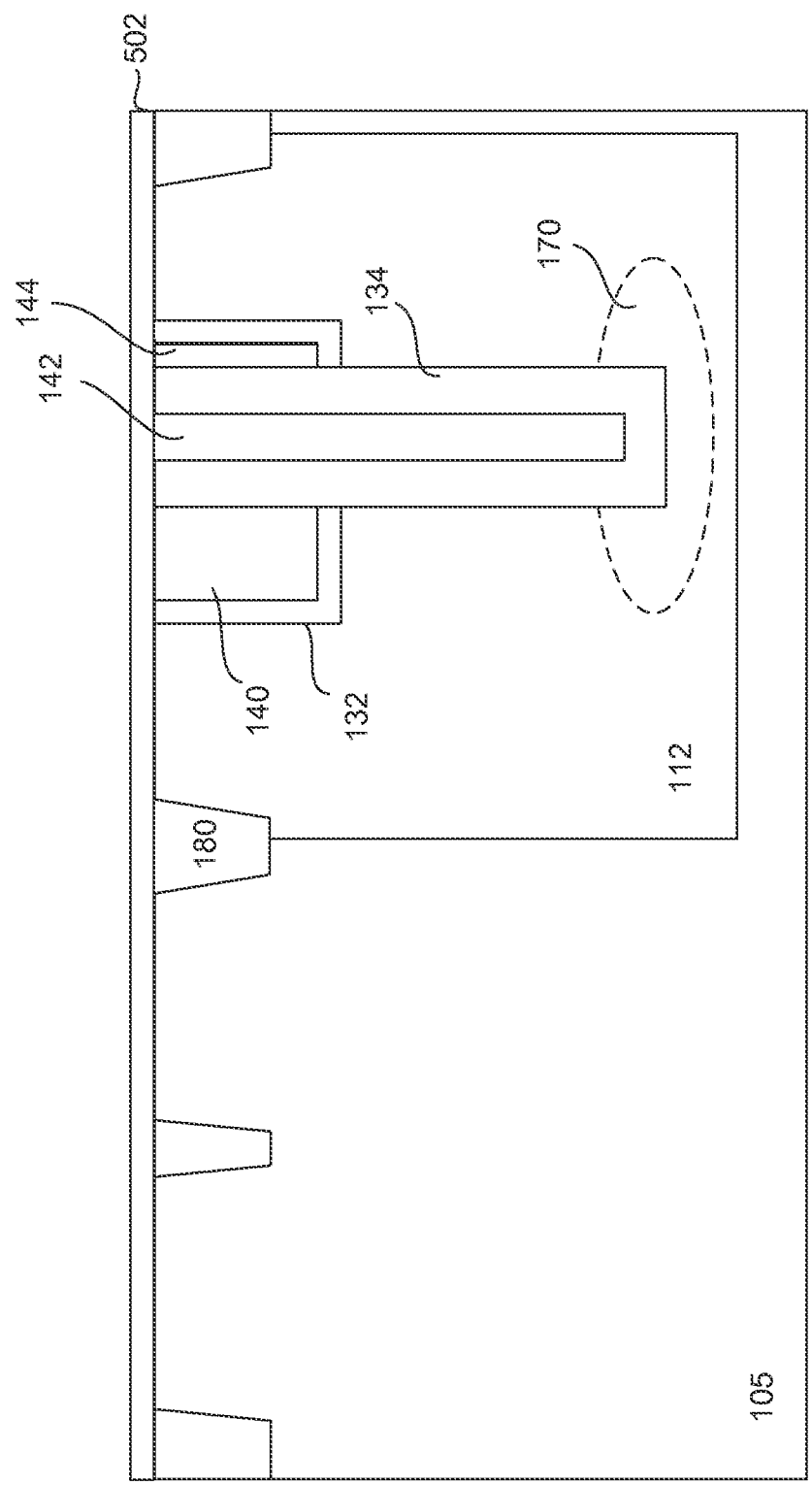

In FIG. 5n, the sacrificial layer is removed. In one embodiment, the sacrificial layer is removed by, for example, a wet etch. Other techniques for removing the sacrificial layer may also be useful.

After the removal of the sacrificial layer, oxidation is performed to form a layer of oxide on the top surface of the second gate dielectric layer and field plate layer. The oxidation, in one embodiment, is a thermal oxidation. In one embodiment, the oxide layer has a top surface which is co-planar with a top surface of the pad layer.

Referring to FIG. 5o, the oxide layer and the pad layer, for example, form a screen oxide layer on the surface of the substrate. The screen oxide layer serves as an implant screen for ion implantations to form doped wells in the substrate.

Various ion implants are performed to form first and second transistor wells 214a-b in the LV device region and second and third device doped wells 114 and 113 in the HV device region. The first transistor well in the LV device region is a first polarity type well, the second transistor well in the LV device region is a second polarity type well, the second doped well in the HV device region is a first polarity type well and the third device doped well in the HV device region is a second polarity type well.

The first transistor well is disposed in the first transistor region 210a and the second transistor well is disposed in the second transistor region 210b. In one embodiment, the transistor wells are disposed below the isolation region and serve as bodies of subsequently formed first and second transistors in the LV device region. A depth of the transistor wells, for example, may be about 0.1-0.3 μm. Other depths may also be useful. As shown, the wells abut each other. Providing non-abutting wells may also be useful.

As for the second doped well 114, it is disposed adjacent to the drain side of the trench transistor while the third doped well 113 is disposed adjacent to the source side of the trench transistor. In one embodiment, the second doped well has a bottom below the isolation region and the third doped well has a bottom above the bottom of the isolation region. The depth of the second doped well may be about 0.1-0.3 μm, whereas the depth of the third doped well may be about 0.1-0.5 μm. Other depths may also be useful.

Figure 5P:
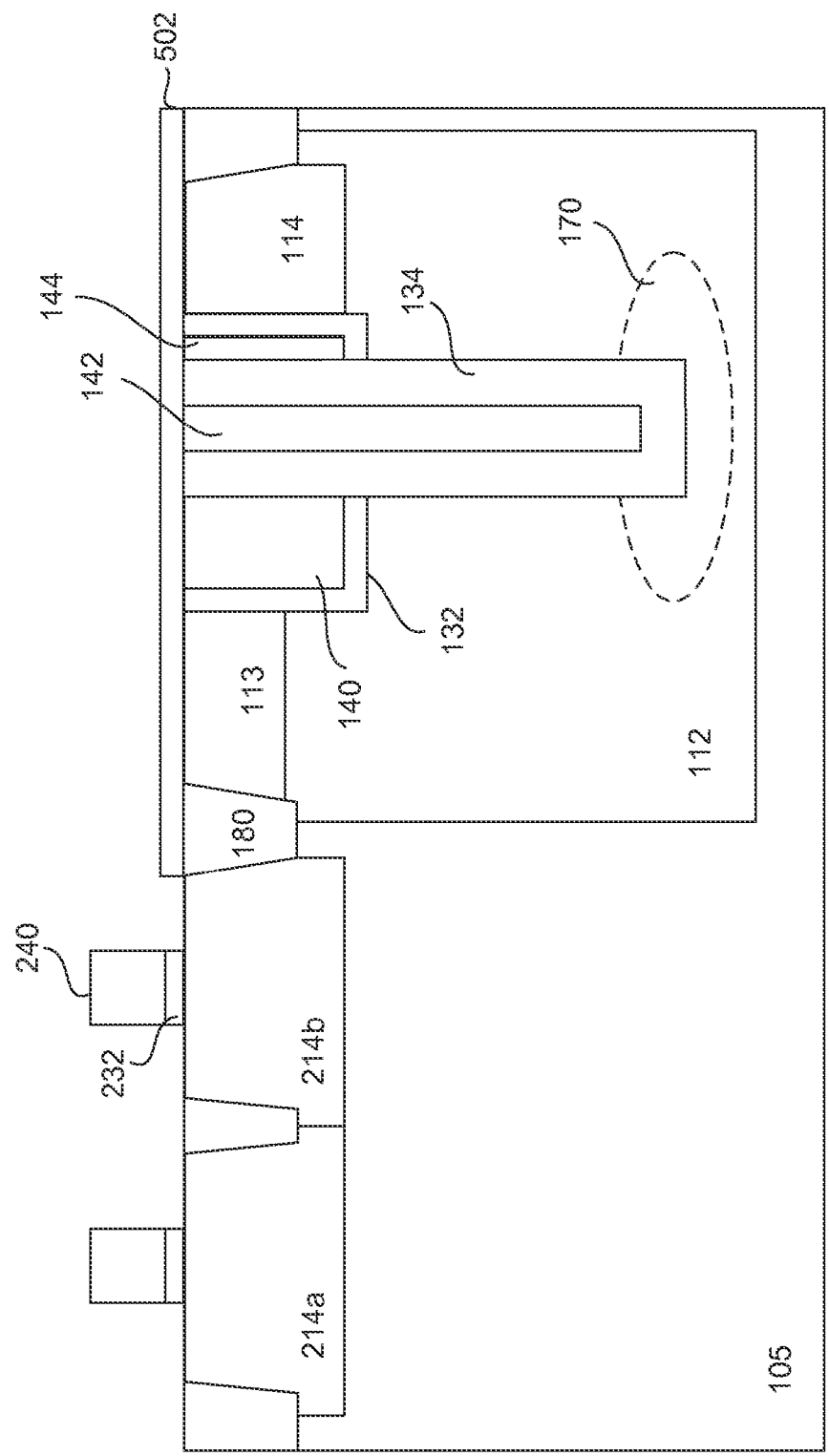
Figure 5A:
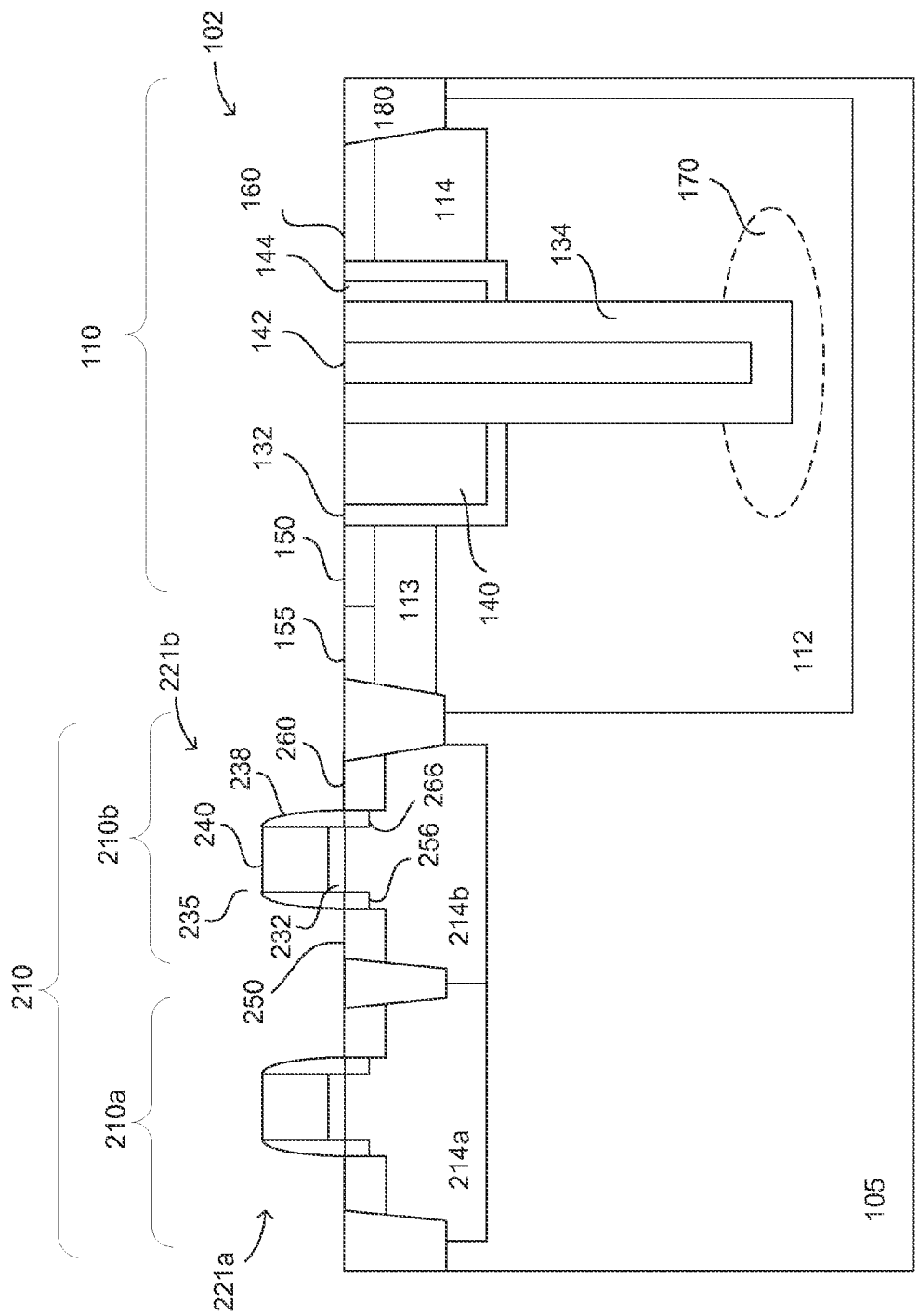

As shown in FIG. 5p, the process continues to form gates of transistors in the LV device region. In one embodiment, the screen oxide layer in the LV device region is removed to expose the surface of the substrate. For example, a mask, such as a photoresist, is provided to protect the HV device region, leaving the LV device region exposed. An etch, such as a wet etch, removes the screen oxide layer in the LV device region. The etch, for example, is a wet etch. Other techniques may also be used to remove the screen oxide in the LV device region.

The mask is removed, for example, by wet etch. Other techniques for removing the mask may also be useful. For example, the mask may be removed by ashing. After the removal of the mask, the gate layers are formed on the substrate. For example, gate dielectric and gate electrode layers are formed on the substrate, covering the exposed surface of the substrate in the LV device region and the screen oxide on the HV device region.

The gate dielectric layer 232, in one embodiment, is silicon oxide. Other types of gate dielectric materials may also be useful. The gate dielectric layer, in one embodiment, is formed by thermal process, such as thermal oxidation. For example, the gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the gate dielectric layer may be formed by a partial wet oxidation. The thermal process selectively forms the gate dielectric layer on the exposed surface of the substrate. Other techniques for forming the gate dielectric layer may also be useful. The thickness of the gate dielectric layer is about that used for LV transistors. For example, the thickness of the gate dielectric layer may be about 100-1000 Å. Other thicknesses for the gate dielectric layer may also be useful.

The gate electrode layer 240, for example, is polysilicon. The thickness of the gate electrode layer, for example, maybe about 500-5000 Å. Other types of gate electrode layers, thicknesses or techniques for forming the gate electrode layer may also be useful. For example, the gate electrode layer may be TaN, TiN, WSix or other types of gate electrode material or may be formed by techniques such as atomic layered deposition (ALD) or sputtering. The gate electrode layer may be doped to reduce resistance, adjust $V_T$, adjust work function or a combination thereof. The type of dopants and dopant concentration may be appropriately selected based on the design requirements. The gate electrode layer may be in situ doped during formation or doped by ion implantation after the formation of the gate electrode layer.

The gate dielectric and the gate electrode layers are patterned to form gate stacks of first and second transistors 212a-b on the transistor regions. Mask and etch techniques may be employed to form the gate stacks. For example, a patterned photoresist mask may be used as an etch mask for a RIE to form the gate stacks. Other techniques for patterning the gate dielectric layer and the gate electrode layer may also be useful. After forming the gate stacks, the mask layer is removed.

In one embodiment, as shown in FIG. 5q, LDD regions 256 and 266 are formed in the LV device region. For example, first type LDD regions are formed in the first LV transistor sub-region and second type LDD regions are formed in the second LV transistor sub-region. Implant masks, such as photoresist, may be used to facilitate forming the LDD regions. Separate implant processes are performed to form the different LDD regions. The process parameters of the implantation, such as dose and energy, may be appropriately selected based on design requirements. An implant mask may be removed after each implant process by, for example, ashing.

The process continues, for example, to form spacers 238 on sidewalls of the gates of the LV transistors. The spacers, for example, are silicon nitride spacers. Other types of gate spacer materials may also be useful. To form the spacers, a spacer layer is deposited on the substrate. The spacer layer can be formed by using various techniques, such as plasma enhanced chemical vapor deposition (PECVD). Other techniques to form the spacer layer or forming other types of sidewall spacers may also be useful. The spacer layer is anisotropically etched, such as by RIE, to remove horizontal portions, leaving non-horizontal portions on the sidewalls of the gates as the spacers. In one embodiment, the etch to form the spacer is selective to the screen oxide and substrate. This, for example, exposes the substrate surface in the LV region and the screen oxide in the HV device region.

Doped contact regions of the transistors in the LV and HV device regions are formed. The doped contact regions include S/D regions 250 and 260 of the LV transistors and the source and drain regions 150 and 160 of the trench transistor, as well as the body bias contact region 155 are formed in the substrate. The doped contact regions are heavily doped contact regions. The doped contact regions are formed by implant processes.

In one embodiment, the doped contact regions of the transistors in the LV and HV device regions have the same parameters, except polarity type.

In one embodiment, the doped contact regions of the first transistor and source and drain contact regions of the trench transistor have the same parameters. As such, these doped contact regions can be formed using the same implant process. The doped contact regions of the second transistor and the body bias contact region of the trench transistor have the same parameters. As such, these doped contact regions can be formed using the same implant process.

An implant process is performed with an implant mask. The implant mask, for example, may be a patterned photoresist layer. The implant mask exposes the portion of the substrate which dopants are implanted. Different implant processes are performed using, for example, different implant masks and appropriate implant parameters.

The process continues to forming the device. For example, metal silicide contacts may be formed on the contact regions, such as the doped contact regions and gates of the transistors. Additional processes may be performed to complete the device. For example, interconnect metal levels may be provided to form interconnections to the terminals of the transistor and other circuit components, as desired. Other processes may include, for example, final passivation, dicing, packaging and testing.

Figure 6A:
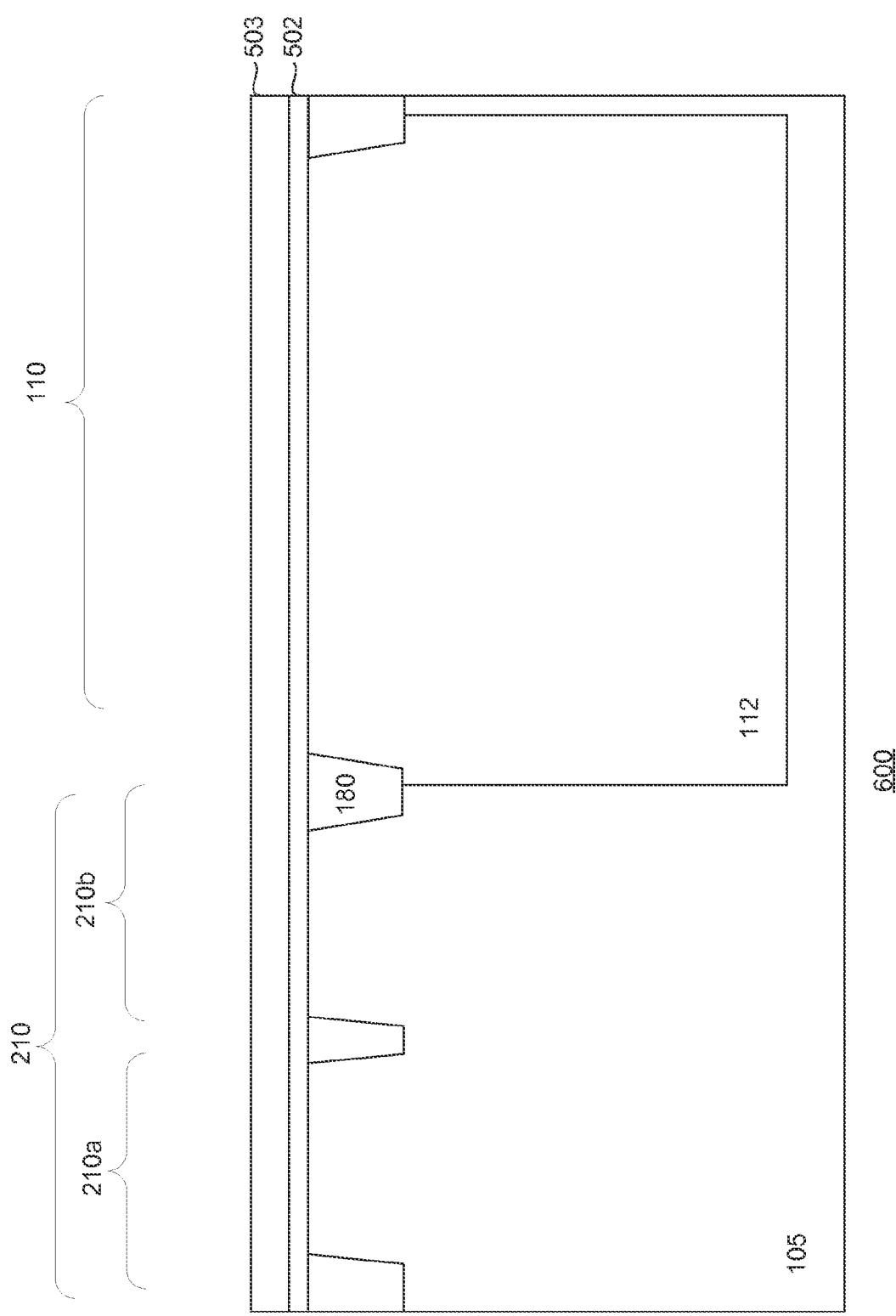

FIGS. 6a-6l show cross-sectional views of an embodiment of a process 600 for forming a device or IC. Referring to FIG. 6a, a partially processed substrate 105 is provided. The substrate is at a stage of processing as described in FIG. 5b. As such, common features need not be discussed. For example, the substrate includes HV and LV device regions 110 and 210 separated by isolation regions. A hard mask 503 and a pad layer 502 are disposed on the substrate. The hard mask includes an opening corresponding to a trench which is to be formed in the HV device region of the substrate.

Referring to FIG. 6b, an upper portion of a trench 664 is formed in the substrate. In one embodiment, the trench is formed by a RIE, using the hard mask as an etch mask. For example, the RIE recesses the exposed substrate. The upper portion of the trench formed has a depth from the surface of the substrate. The depth, for example, may be about 0.5-5 μm below the surface of the substrate. Other depths may also be useful. The depth, for example, is determined by the requirements of operative voltage.

The exposed trench walls, for example, are cleaned. For example, the trench walls are cleaned to remove any surface damage from the RIE etch. In one embodiment, the cleaning of the trench walls is performed by exposure to hydrogen plasma. Other techniques for cleaning the exposed trench walls may also be useful.

Dopants are implanted into the substrate. In one embodiment, first polarity type dopants are implanted into the substrate. The implant forms a doped region below the bottom of the trench, using the first hard mask layer as an implant mask. An anneal is performed to diffuse and activate the dopants to form a fourth device doped well 375. The fourth device doped well, in one embodiment, is a double-diffused drain (DDD) doped well. In one embodiment, the fourth device doped well is an intermediate doped region with first polarity type dopants. For example, the fourth device doped well may be n doped regions for an n-type device. The dopant concentration, for example, may be about 5E13-5E15/cm$^3$. Forming a fourth device doped well with other dopant concentrations may also be useful.

Figure 6C:
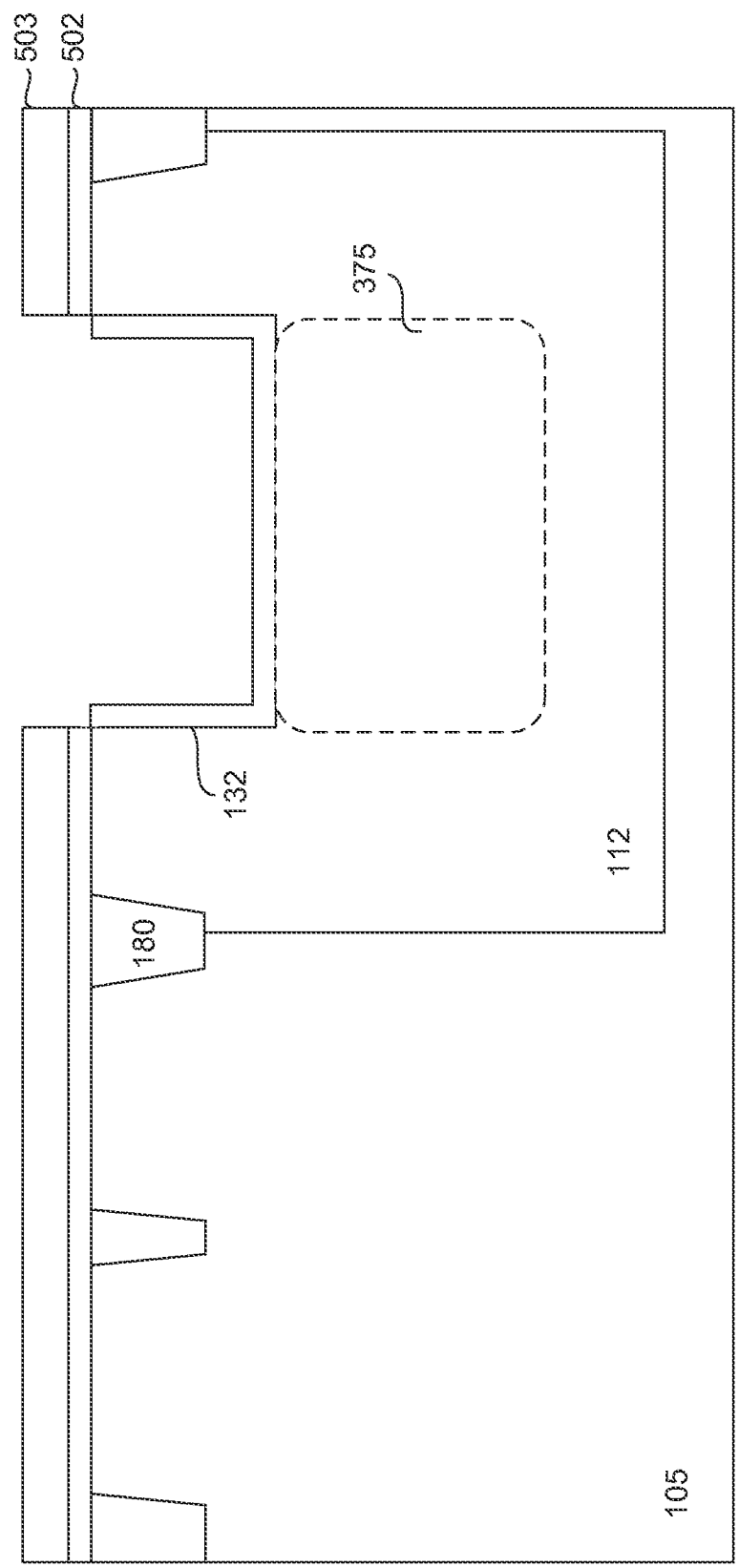

A first gate dielectric layer 132 is formed on the exposed trench walls as shown in FIG. 6c. The first gate dielectric layer, in one embodiment, is silicon oxide. Other types of gate dielectric materials may also be useful. The first gate dielectric layer, in one embodiment, is formed by thermal process, such as thermal oxidation. For example, the first gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the first gate dielectric layer may be formed by a partial wet oxidation. The thermal process selectively forms the first gate dielectric layer on the exposed trench walls. Other techniques for forming the first gate dielectric layer may also be useful. The thickness of the first gate dielectric layer may be about 10-150 Å. Other thicknesses for the first gate dielectric layer may also be useful.

Figure 6D:
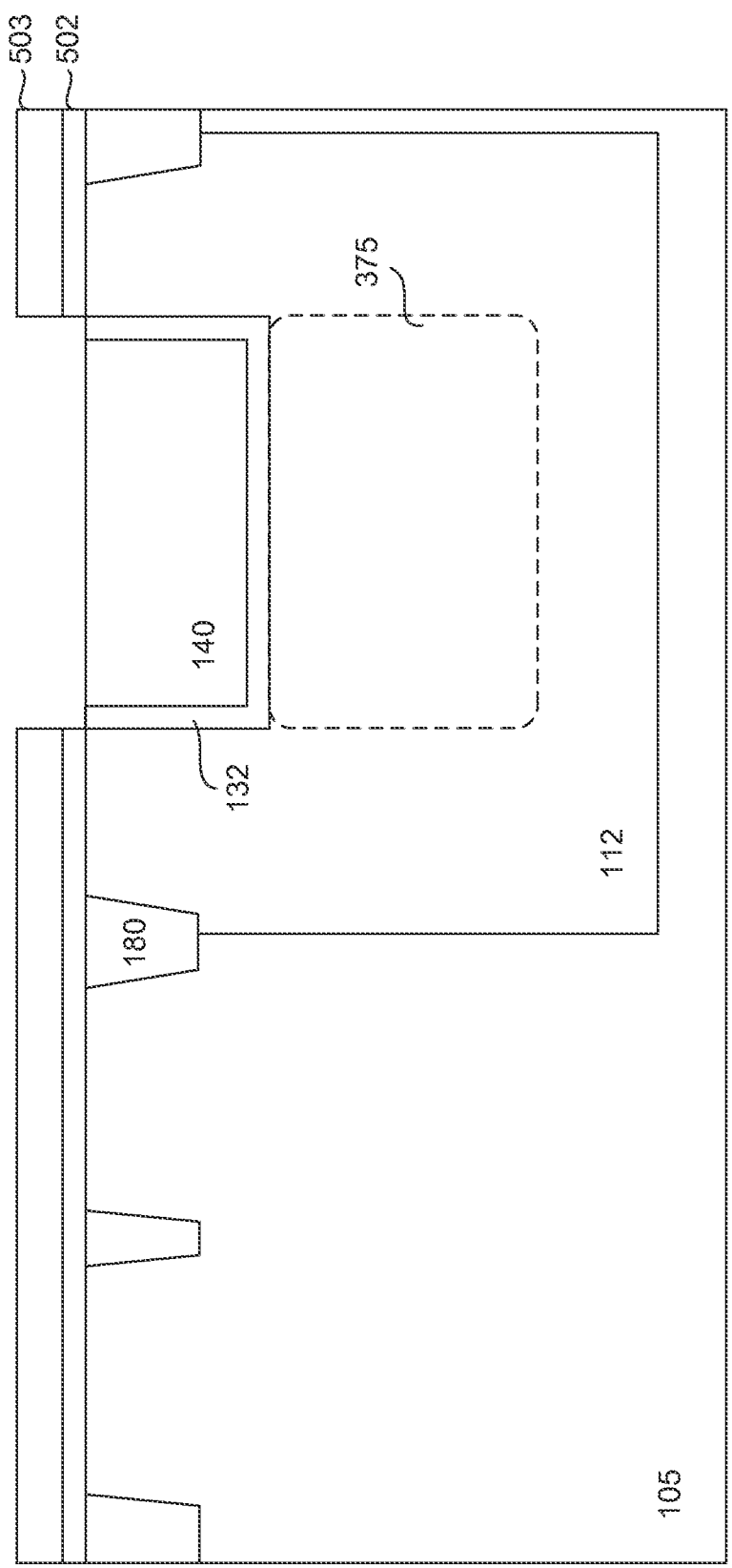

Referring to FIG. 6d, a gate electrode layer 140 is formed on the substrate. The gate electrode layer fills the trench. In one embodiment, the first gate dielectric layer surrounds the gate electrode layer in the trench. The gate electrode layer, in one embodiment, is polysilicon. Other types of gate electrode material may also be useful. For example, the gate electrode layer may be formed of tungsten. The gate electrode layer may be formed by CVD. Other techniques of forming the gate electrode layer may also be useful.

A planarization process is performed to remove excess material of the gate electrode layer. In one embodiment, the planarization process includes a polishing process, such as chemical mechanical polishing (CMP). Alternatively, the excess material of the gate electrode layer is removed by an etch back process. Other types of planarization processes may also be useful to remove the excess gate electrode material. In one embodiment, an over-polish is performed to recess the top surface of the gate electrode layer below the surface of the hard mask. In one embodiment, top surface of the gate electrode is recessed below a top surface of the hard mask layer.

As shown in FIG. 6e, the hard mask is removed. In one embodiment, the hard mask is removed by a wet etch. For example, the hard mask is removed by a wet etch using a chemistry which selectively removes the hard mask material. Other techniques for removing the hard mask may also useful.

After the removal of the hard mask, oxidation is performed to form a layer of oxide on the top surface of the gate electrode layer. The oxidation, in one embodiment, is a thermal oxidation. In one embodiment, the oxide layer has a top surface which is co-planar with a top surface of the pad layer.

Referring to FIG. 6f, a sacrificial layer 504 is formed on the substrate, covering the pad layer. The sacrificial layer, in one embodiment, is silicon nitride. Other types of sacrificial materials may also be useful. The thickness of the sacrificial layer may be about 500-5000 Å. Other thicknesses for the sacrificial layer may also be useful. The sacrificial layer, for example, may be formed by chemical vapor deposition (CVD). Other techniques for forming the sacrificial layer may also be useful.

Figure 6G:
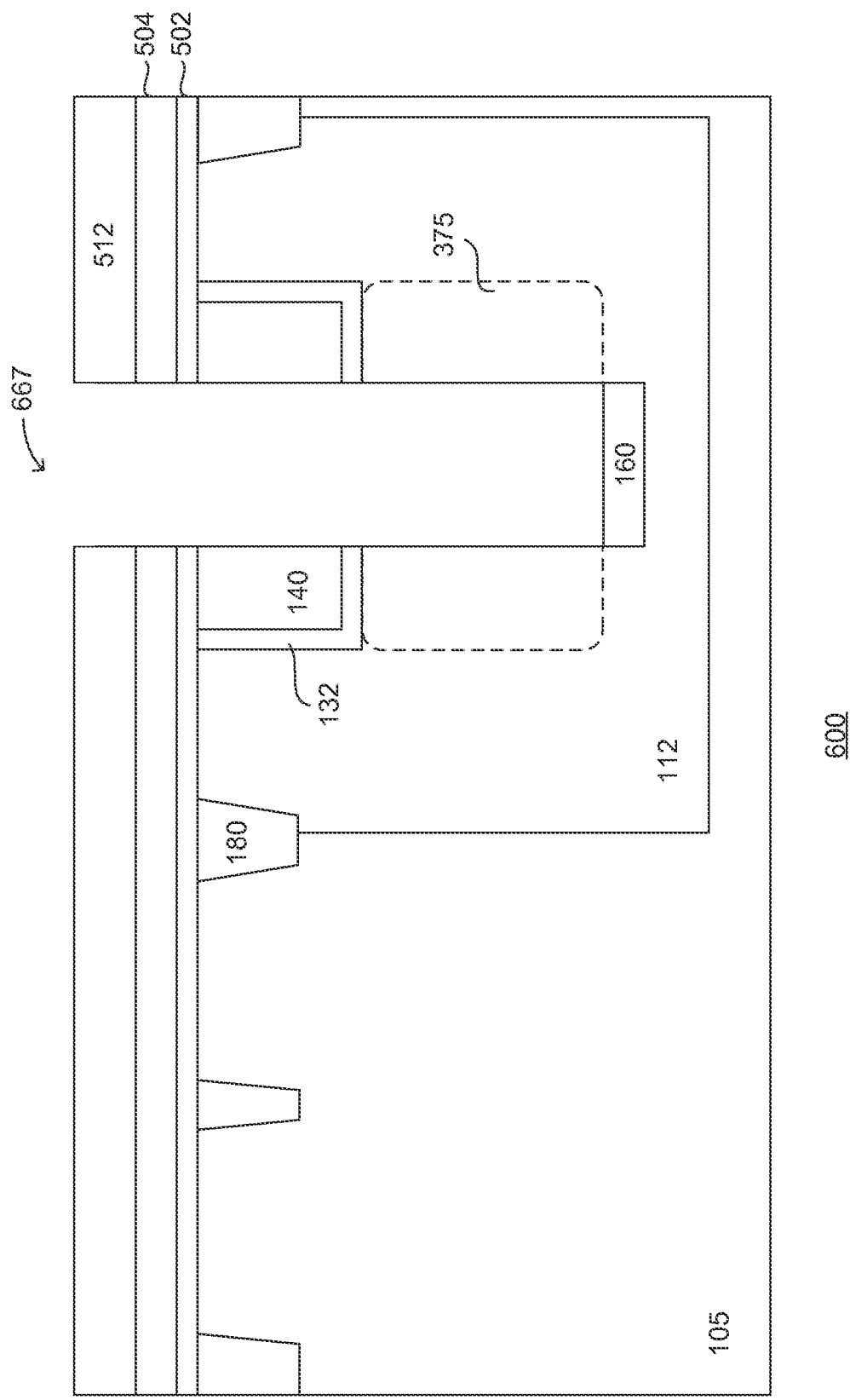

As shown in FIG. 6g, a soft mask 512 is formed on the substrate. The soft mask, as shown, is selectively patterned to create an opening. The soft mask, for example, is formed of a photoresist. The soft mask serves as an etch mask to remove the exposed portion of the sacrificial layer, pad layer and substrate. The etch, for example, is a RIE.

The substrate is etched, for example, by an RIE using the soft mask as an etch mask. The etch forms a trench 667 in the substrate. The depth of the trench, for example, is about 1-15 μm from the surface of the substrate. Other depths of the trench may also be useful. The depth, for example, is determined by the requirement of the operative voltage. In one embodiment, the depth of the trench is shallower than the depth of the first device doped well 112. For example, the trench is substantially disposed with the first device doped well.

The exposed trench sidewalls, for example, are cleaned. For example, the trench sidewalls are cleaned to remove any surface damage from the RIE etch. In one embodiment, the cleaning of the trench sidewalls is performed by exposure to hydrogen plasma. Other techniques for cleaning the trench sidewalls may also be useful. A thermal process, such as thermal oxidation, is carried out to deposit an oxide layer on the trench sidewalls. The oxide layer is subsequently removed, for example, by wet etch.

Dopants are implanted into the substrate. In one embodiment, first polarity type dopants are implanted into the substrate. The implant forms a doped region below the bottom of the trench, using the soft mask as an implant mask. An anneal is performed to diffuse and activate the dopants to form a doped region 160 as shown in FIG. 6g. In one embodiment, the implant forms a doped region from about the bottom edge of the lower portion of the trench to about 0.05-0.3 μm. Other depths may also be useful. The depth, for example, is determined by the requirements of operative voltage. In one embodiment, the doped region is formed within the first device doped well. The doped region serves as a second diffusion region of the device. The second diffusion region, in one embodiment, is a drain region. For example, the second diffusion region is a buried drain region having vertical and lateral displacement components from the gate of the transistor. In one embodiment, the drain region is a heavily doped region with first polarity type dopants. For example, the drain region may be an n doped region for an n-type device. The dopant concentration, for example, may be from about $1E13$-$1E16$/cm$^3$. Forming a drain region with other dopant concentrations may also be useful. The implant energy can be carried out at energy in the range of, for example, approximately 10-100 KeV. Other implant energies and/or doses may be used to form the drain region.

Referring to FIG. 6h, the soft mask is removed. The soft mask, for example, may be removed by wet etch. Other techniques for removing the soft mask may also be useful.

After the removal of the soft mask, a second gate dielectric layer 134 is formed on the exposed portion of the trench sidewalls. In one embodiment, the second gate dielectric layer lines the exposed portion of the trench sidewalls, leaving a gap 668 in the trench. The gap corresponds to a trench in which a field plate of a transistor is formed. The second gate dielectric layer, in one embodiment, is silicon oxide. Other types of gate dielectric materials may also be useful. The second gate dielectric layer, in one embodiment, is formed by thermal process, such as thermal oxidation. For example, the second gate dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the second gate dielectric layer may be formed by a partial wet oxidation. The thermal process selectively forms the second gate dielectric layer on the exposed trench sidewalls. Other techniques for forming the second gate dielectric layer may also be useful. The thickness of the second gate dielectric layer may be about 0.05-1 μm. Other thicknesses for the second gate dielectric layer may also be useful.

Figure 6I:
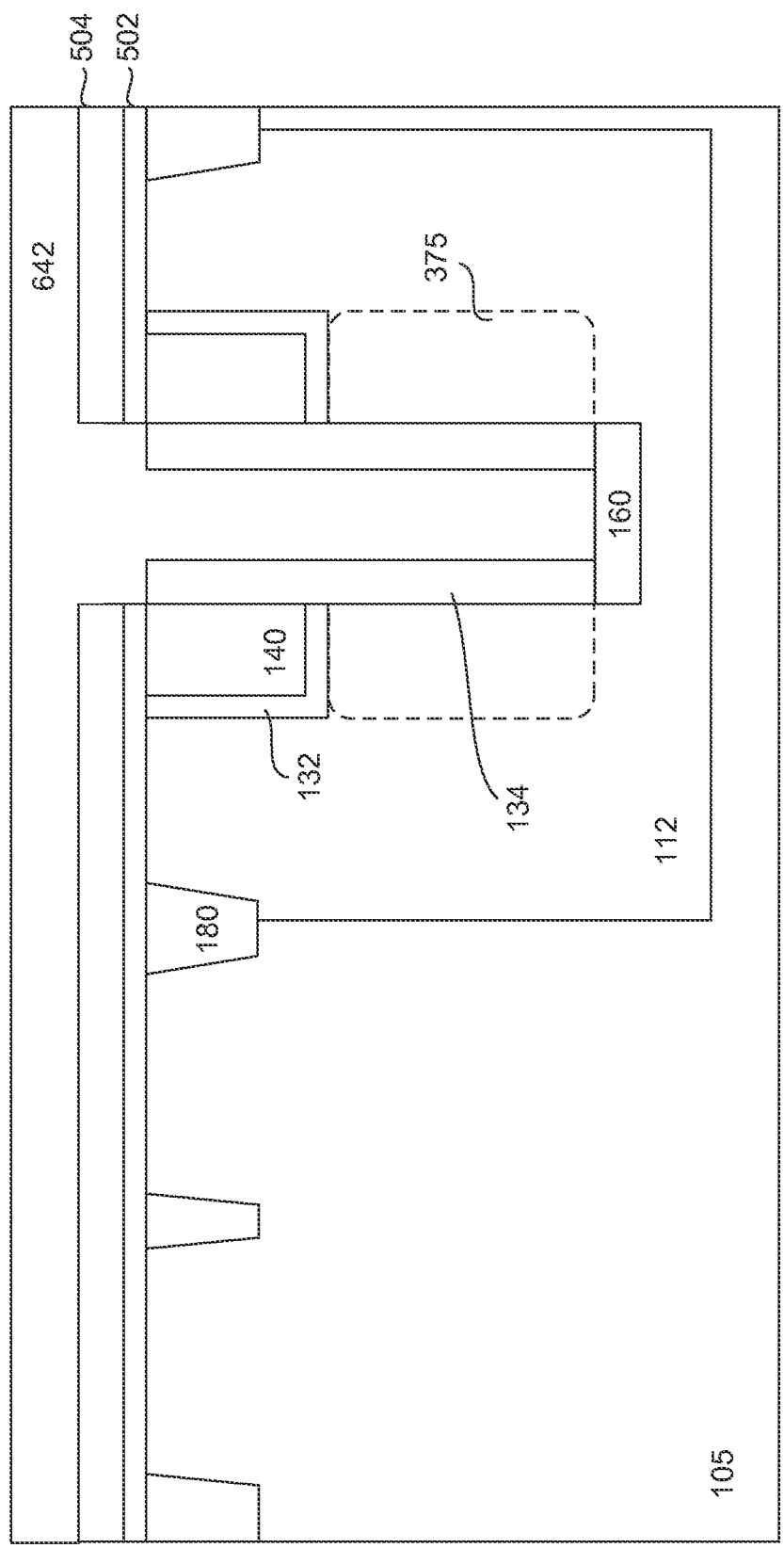

Referring to FIG. 6i, a field plate layer 642 is formed on the substrate. The field plate layer fills the gap in the trench and covers the substrate. In one embodiment, the second gate dielectric layer lines the sidewalls of the lower trench portion and isolates the gate electrode from the field plate in the upper trench portion. The field plate layer, in one embodiment, is polysilicon. Other types of field plate material may also be useful. For example, the field plate layer may be formed of tungsten (W). The field plate layer may be formed by CVD. Other techniques of forming the field plate layer may also be useful.

Figure 6J:
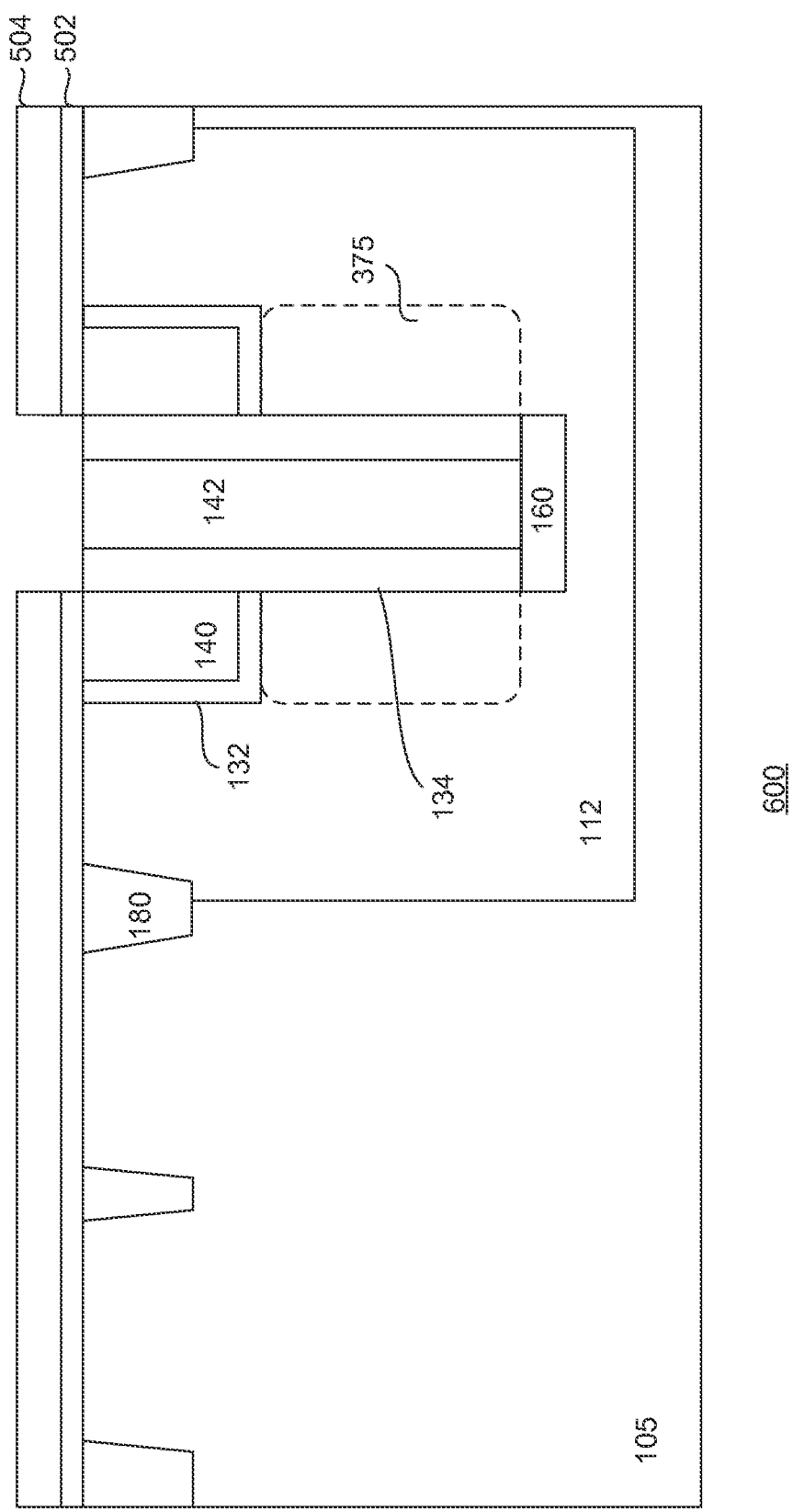

Referring to FIG. 6j, a planarization process is performed to remove excess materials of the second gate dielectric layer and field plate layer. In one embodiment, the planarization process includes a polishing process, such as chemical mechanical polishing (CMP). Alternatively, the excess materials of the second gate dielectric layer and field plate layer are removed by an etch back process. Other types of planarization processes may also be useful to remove the excess materials. In one embodiment, an over-polish is performed to recess the top surface of the second gate dielectric layer and field plate layer below the surface of the sacrificial layer. In one embodiment, top surface of second gate dielectric layer and field plate layer is recessed below a top surface of the sacrificial layer.

Figure 6K:
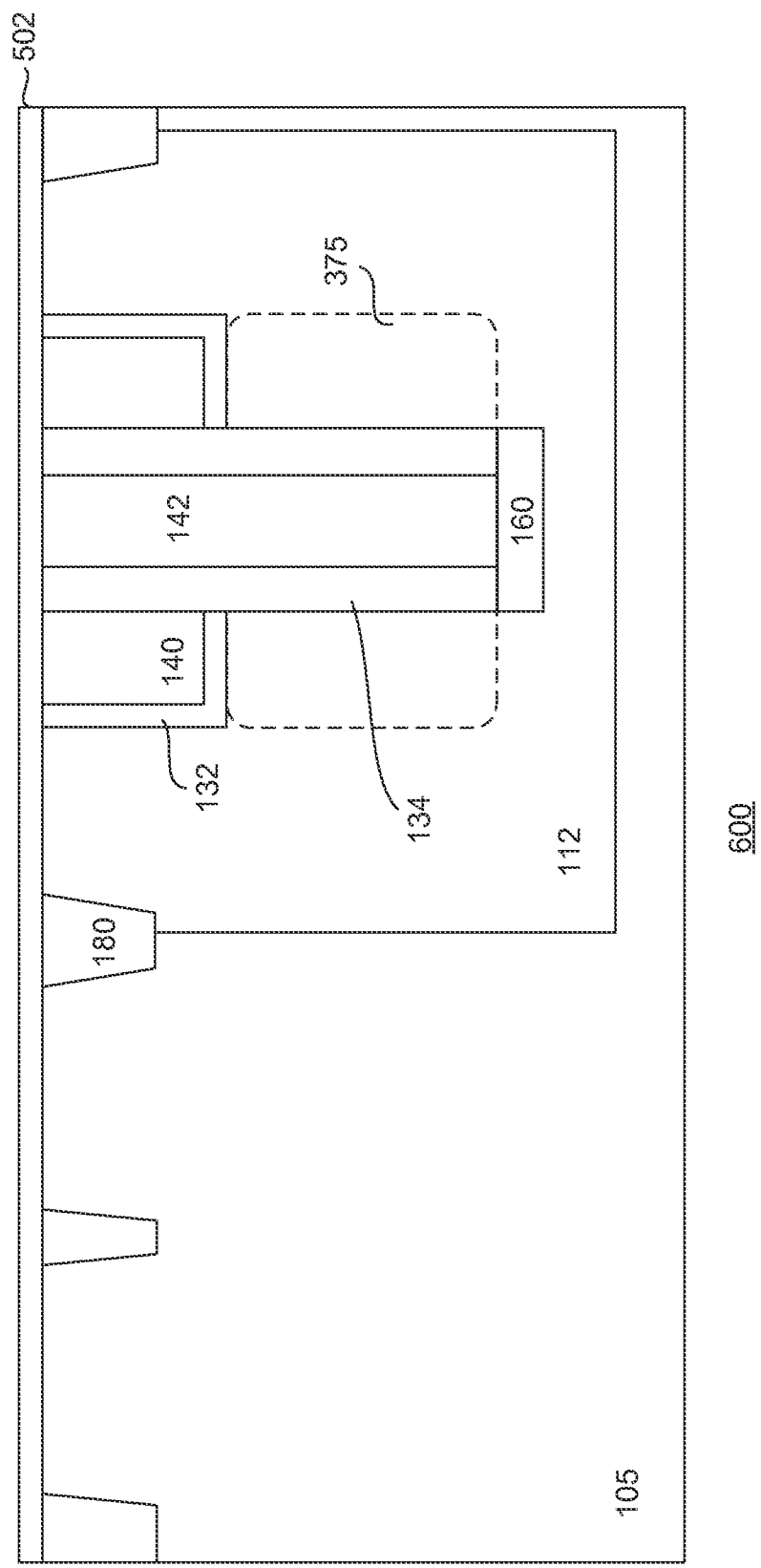
Figure 6I:
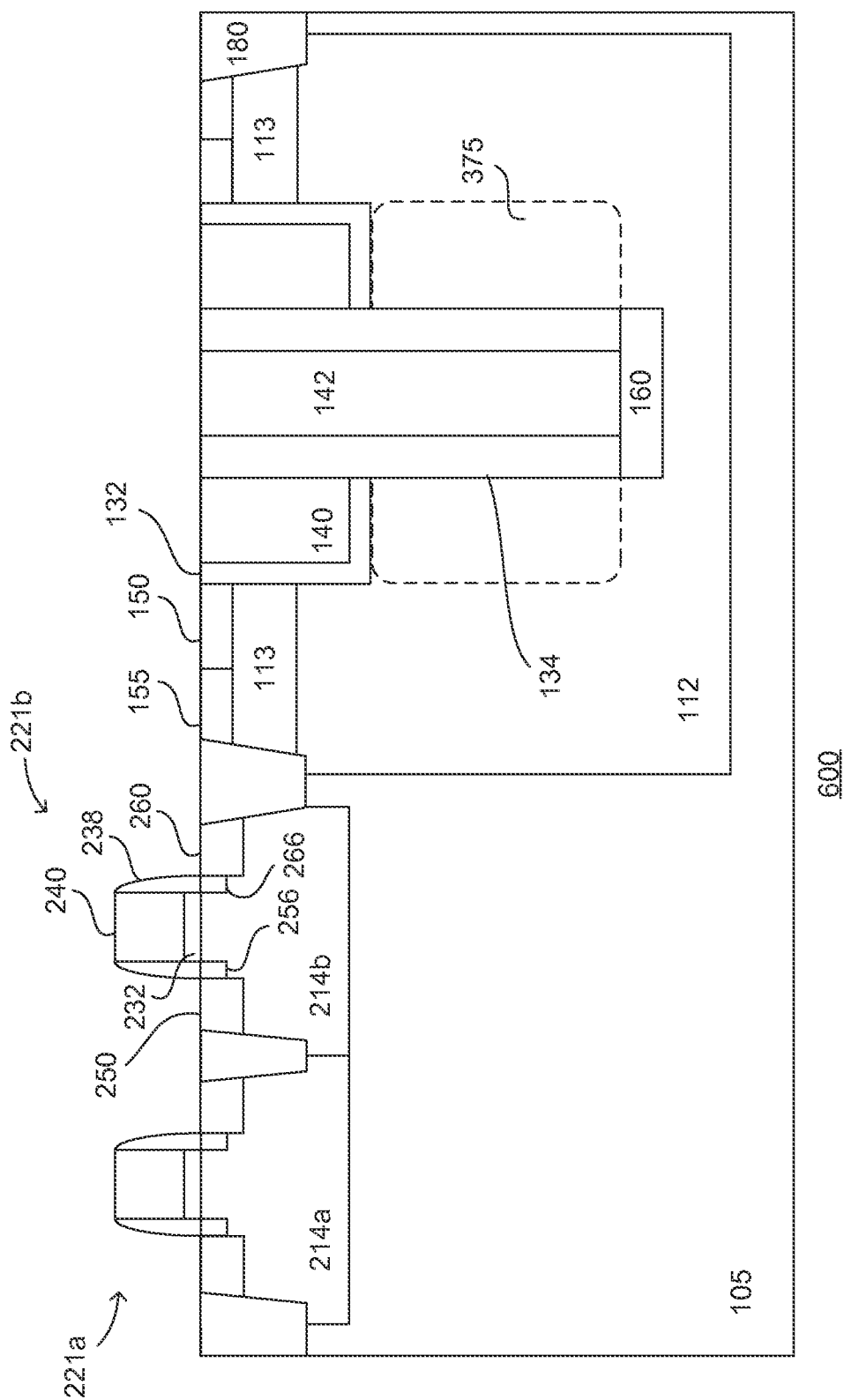

In FIG. 6k, the sacrificial layer is removed. In one embodiment, the sacrificial layer is removed by, for example, a wet etch. Other techniques for removing the sacrificial layer may also be useful.

After the removal of the sacrificial layer, oxidation is performed to form a layer of oxide on the top surface of the second gate dielectric layer and field plate layer. The oxidation, in one embodiment, is a thermal oxidation. In one embodiment, the oxide layer has a top surface which is co-planar with a top surface of the pad layer. The oxide layer and the pad layer, for example, form a screen oxide layer on the surface of the substrate. The screen oxide layer serves as an implant screen for ion implantations to form doped wells in the substrate. The process continues as described in FIG. 5p and onwards to form the device as shown in FIG. 6l.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A semiconductor device comprising:
   a substrate defined with a device region;
   a first device doped well within the substrate, wherein the first device doped well encompasses the device region;
   a gate disposed in the substrate, wherein the gate comprises a gate electrode and a first gate dielectric layer disposed in a first trench, wherein the first trench defines an upper trench portion;
   a second trench disposed within the gate, wherein the second trench extends below the upper trench portion and defines a lower trench portion;
   a second gate dielectric layer disposed in the second trench, wherein the second gate dielectric layer at least lines the lower trench portion;
   a field plate disposed in the second trench, wherein the field plate fills the trench and is disposed adjacent to the gate;
   first and second diffusion regions disposed within the device region, wherein the gate is displaced from the second diffusion region; and
   wherein the first device doped well surrounds the upper and lower trench portions and extends to a depth below the lower trench portion, the first device doped well includes same polarity type dopants as the first and second diffusion regions.

2. The semiconductor device of claim 1 comprising second and third device doped wells disposed within the first device doped well, wherein the second and third device doped wells are adjacent to first and second sides of the first trench and include a depth shallower than the upper trench portion.

3. The semiconductor device of claim 1 comprising an intermediately doped region within the first device doped well, wherein the intermediately doped region is disposed below the gate and includes same polarity type dopants as the first device doped well.

4. The semiconductor device of claim 1 wherein the second gate dielectric layer isolates the field plate from the gate in the upper trench portion and wraps around the field plate in the lower trench portion.

5. The semiconductor device of claim 3 wherein the intermediately doped well surrounds a lower portion of the second gate dielectric layer.

6. The semiconductor device of claim 3 wherein the intermediately doped well is disposed from about a bottom edge of the upper trench portion to about a bottom edge of the lower trench portion.

7. A semiconductor device comprising:
a substrate defined with a device region;
a first device doped well within the substrate, wherein the first device doped well encompasses the device region;
a gate having a gate electrode and first and second gate dielectric layers disposed in a trench in the substrate, wherein the trench comprises upper and lower trench portions, wherein the first gate dielectric layer lines the upper trench portion and the second gate dielectric layer extends through the upper trench portion and lines the lower trench portion;
a field plate disposed in the upper and lower trench portions, wherein the field plate is disposed adjacent to the gate and extends below the gate;
source and drain regions disposed within the device region, wherein the gate is displaced from the drain region; and
wherein the first device doped well surrounds the upper and lower trench portions and extends to a depth below the lower trench portion, the first device doped well includes same polarity type dopants as the source and drain regions.

8. The semiconductor device of claim 7 comprising second and third device doped wells disposed within the first device doped well, wherein the second and third device doped wells include a depth shallower than the upper trench portion.

9. The semiconductor device of claim 8 wherein the first device doped well comprises first polarity type dopants and the third device doped well comprises second polarity type dopants different from the first polarity type.

10. The semiconductor device of claim 8 comprising a buried doped region in the substrate, wherein the buried doped region is disposed in the first device doped well and below the lower trench portion.

11. The semiconductor device of claim 10 wherein the buried doped region surrounds a lower portion of the field plate and second gate dielectric layer in the lower trench portion.

12. The semiconductor device of claim 11 wherein the second gate dielectric layer isolates the field plate from the gate electrode in the upper trench portion and wraps around the field plate in the lower trench portion.

13. The semiconductor device of claim 7 wherein the gate is laterally displaced from the drain region by at least the first gate dielectric layer, second gate dielectric layer and field plate.

14. The semiconductor device of claim 8 comprising a double diffused drain (DDD) doped well in the first device doped well.

15. The semiconductor device of claim 14 wherein the DDD doped well is disposed from about a bottom edge of the upper trench portion to about a bottom edge of the lower trench portion.

16. The semiconductor device of claim 7 wherein the second gate dielectric layer isolates the field plate from the gate electrode in the upper trench portion and lines sidewalls of the lower trench portion.

17. The semiconductor device of claim 9 wherein:
the source region is disposed adjacent to the gate and within the third device doped well; and
the drain region is disposed below the upper trench portion and is contiguous to a bottom edge of the lower trench portion.

18. The semiconductor device of claim 7 wherein the device region is surrounded by a device isolation region.

19. The semiconductor device of claim 18 wherein the device region comprises one or more internal device isolation regions, dividing the device region into multiple device sub-regions.

20. The semiconductor device of claim 19 comprising a low voltage device in the multiple device sub-regions, wherein the low voltage device comprises:
a gate having a gate electrode and gate dielectric disposed on the substrate;
source/drain regions disposed in the substrate adjacent to the gate; and
a channel region disposed in the substrate under the gate between the source/drain regions.

* * * * *